(12) United States Patent
Green et al.

(10) Patent No.: US 8,772,174 B2
(45) Date of Patent: Jul. 8, 2014

(54) METHOD OF FABRICATING STRUCTURED PARTICLES COMPOSED OF SILICON OR SILICON-BASED MATERIAL AND THEIR USE IN LITHIUM RECHARGEABLE BATTERIES

(75) Inventors: Mino Green, London (GB); Feng-Ming Liu, Reading (GB); Yuxiong Jiang, Abingdon (GB); Valerie Elizabeth Dawn Stevens, Middlesex (GB); Benjamin Odarkwei Mills-Lamptey, Enfield (GB)

(73) Assignee: Nexeon Ltd., Oxfordshire (GB)

(*) Notice: Subject to any disclaimer, the term of this patent is extended or adjusted under 35 U.S.C. 154(b) by 0 days.

(21) Appl. No.: 13/639,395

(22) PCT Filed: Apr. 8, 2011

(86) PCT No.: PCT/GB2011/000546
§ 371 (c)(1),
(2), (4) Date: Dec. 17, 2012

(87) PCT Pub. No.: WO2011/124893
PCT Pub. Date: Oct. 13, 2011

(65) Prior Publication Data
US 2013/0122717 A1 May 16, 2013

(30) Foreign Application Priority Data
Apr. 9, 2010 (GB) .................................. 1005979.8

(51) Int. Cl.
*H01L 21/302* (2006.01)
*H01L 21/461* (2006.01)

(52) U.S. Cl.
USPC ............... 438/745; 438/753; 216/83; 216/96; 216/99; 216/103; 216/104

(58) Field of Classification Search
None
See application file for complete search history.

(56) References Cited

U.S. PATENT DOCUMENTS

| 3,351,445 A | 11/1967 | Fielder et al. |
| 4,002,541 A | 1/1977 | Streander |

(Continued)

FOREIGN PATENT DOCUMENTS

| CN | 1821446 A | 8/2006 |
| CN | 101266919 A | 9/2008 |

(Continued)

OTHER PUBLICATIONS

Badel et al., "Formation of Ordered Pore Arrays at the Nanoscale by Electrochemical Etching of N-Type Silicon", Superlattices and Microstructures, 36 (2004) 245-253.

(Continued)

*Primary Examiner* — Duy Deo
(74) *Attorney, Agent, or Firm* — Fay Sharpe LLP

(57) ABSTRACT

A method for treating silicon to form pillars, especially for use as the active anode material in Li-ion batteries, is disclosed. The process is simple to operate on a commercial scale since it uses a solution containing only a small number of ingredients whose concentration needs to be controlled and it can be cheaper to operate than previous processes. The solution includes: 0.01 to 5M HF 0.002 to 0.2M of metal ions capable of nucleating on and forming a porous layer comprising regions of elemental metal on the silicon surface; 0.001 to 0.7M of an oxidant selected from the group $O_2$, $O_3$, $H_2O_2$, the acid, ammonium or alkali metal salt of $NO_3^-$, $S_2O_8^{2-}$, $NO_2^-$, $B_4O_7^{2-}$ and $ClO_4^-$ or a mixture thereof. The treated silicon is suitably removed from the solution.

28 Claims, 8 Drawing Sheets

(56) References Cited

U.S. PATENT DOCUMENTS

| | | |
|---|---|---|
| 4,436,796 A | 3/1984 | Huggins et al. |
| 4,950,566 A | 8/1990 | Huggins et al. |
| 5,260,148 A | 11/1993 | Idota |
| 5,262,021 A | 11/1993 | Lehmann et al. |
| 5,660,948 A | 8/1997 | Barker |
| 5,907,899 A | 6/1999 | Dahn et al. |
| 5,980,722 A | 11/1999 | Kuroda et al. |
| 6,022,640 A | 2/2000 | Takada et al. |
| 6,042,969 A | 3/2000 | Yamada et al. |
| 6,063,995 A | 5/2000 | Bohland et al. |
| 6,235,427 B1 | 5/2001 | Idota et al. |
| 6,296,969 B1 | 10/2001 | Yano et al. |
| 6,334,939 B1 | 1/2002 | Zhou et al. |
| 6,337,156 B1 | 1/2002 | Narang et al. |
| 6,353,317 B1 | 3/2002 | Green et al. |
| 6,399,177 B1 | 6/2002 | Fonash et al. |
| 6,399,246 B1 | 6/2002 | Vandayburg et al. |
| 6,589,696 B2 | 7/2003 | Matsubara et al. |
| 6,605,386 B1 | 8/2003 | Kasamatsu et al. |
| 6,620,547 B1 | 9/2003 | Sung et al. |
| 6,887,511 B1 | 5/2005 | Shima et al. |
| 6,916,679 B2 | 7/2005 | Snyder et al. |
| 7,033,936 B1 | 4/2006 | Green |
| 7,051,945 B2 | 5/2006 | Empedocles et al. |
| 7,070,632 B1 | 7/2006 | Visco et al. |
| 7,094,499 B1 | 8/2006 | Hung |
| 7,147,894 B2 | 12/2006 | Zhou et al. |
| 7,192,673 B1 | 3/2007 | Ikeda et al. |
| 7,311,999 B2 | 12/2007 | Kawase et al. |
| 7,318,982 B2 | 1/2008 | Gozdz et al. |
| 7,348,102 B2 | 3/2008 | Li et al. |
| 7,358,011 B2 | 4/2008 | Fukuoka et al. |
| 7,378,041 B2 | 5/2008 | Asao et al. |
| 7,425,285 B2 | 9/2008 | Asao et al. |
| 7,476,469 B2 | 1/2009 | Ota et al. |
| 7,569,202 B2 | 8/2009 | Farrell et al. |
| 7,659,034 B2 | 2/2010 | Minami et al. |
| 7,674,552 B2 | 3/2010 | Nakai et al. |
| 7,767,346 B2 | 8/2010 | Kim et al. |
| 7,862,933 B2 | 1/2011 | Okumura et al. |
| 8,034,485 B2 | 10/2011 | Dahn et al. |
| 8,597,831 B2 | 12/2013 | Green et al. |
| 2001/0023986 A1 | 9/2001 | Mancevski |
| 2003/0135989 A1 | 7/2003 | Huggins et al. |
| 2004/0072067 A1 | 4/2004 | Minami et al. |
| 2004/0126659 A1 | 7/2004 | Graetz et al. |
| 2004/0151987 A1 | 8/2004 | Kawase et al. |
| 2004/0166319 A1 | 8/2004 | Li et al. |
| 2004/0185346 A1 | 9/2004 | Takeuchi et al. |
| 2004/0197660 A1 | 10/2004 | Sheem et al. |
| 2004/0214085 A1 | 10/2004 | Sheem et al. |
| 2004/0224231 A1 | 11/2004 | Fujimoto et al. |
| 2004/0241548 A1 | 12/2004 | Nakamoto et al. |
| 2005/0042515 A1 | 2/2005 | Hwang et al. |
| 2005/0079414 A1 | 4/2005 | Yamamoto et al. |
| 2005/0079420 A1 | 4/2005 | Cho et al. |
| 2005/0118503 A1 | 6/2005 | Honda et al. |
| 2005/0191550 A1 | 9/2005 | Satoh et al. |
| 2005/0193800 A1 | 9/2005 | DeBoer et al. |
| 2005/0214644 A1 | 9/2005 | Aramata et al. |
| 2006/0003226 A1 | 1/2006 | Sawa et al. |
| 2006/0011588 A1* | 1/2006 | Stinson et al. .................. 216/99 |
| 2006/0019115 A1 | 1/2006 | Wang et al. |
| 2006/0019168 A1 | 1/2006 | Li et al. |
| 2006/0024582 A1 | 2/2006 | Li et al. |
| 2006/0051670 A1 | 3/2006 | Aramata et al. |
| 2006/0057463 A1 | 3/2006 | Gao et al. |
| 2006/0088767 A1 | 4/2006 | Li et al. |
| 2006/0097691 A1 | 5/2006 | Green |
| 2006/0134516 A1 | 6/2006 | Im et al. |
| 2006/0134518 A1 | 6/2006 | Kogetsu et al. |
| 2006/0147800 A1 | 7/2006 | Sato et al. |
| 2006/0154071 A1 | 7/2006 | Homma et al. |
| 2006/0166093 A1 | 7/2006 | Zaghib et al. |
| 2006/0175704 A1 | 8/2006 | Shimizu et al. |
| 2006/0257307 A1 | 11/2006 | Yang |
| 2006/0263687 A1 | 11/2006 | Leitner et al. |
| 2006/0275663 A1 | 12/2006 | Matsuno et al. |
| 2006/0275668 A1 | 12/2006 | Peres et al. |
| 2006/0286448 A1 | 12/2006 | Snyder et al. |
| 2007/0003835 A1 | 1/2007 | Hasegawa et al. |
| 2007/0026313 A1 | 2/2007 | Sano |
| 2007/0031733 A1 | 2/2007 | Kogetsu et al. |
| 2007/0037063 A1 | 2/2007 | Choi et al. |
| 2007/0048609 A1 | 3/2007 | Ueda et al. |
| 2007/0059598 A1 | 3/2007 | Yang |
| 2007/0065720 A1 | 3/2007 | Hasegawa et al. |
| 2007/0072074 A1 | 3/2007 | Yamamoto et al. |
| 2007/0087268 A1 | 4/2007 | Kim et al. |
| 2007/0099084 A1 | 5/2007 | Huang et al. |
| 2007/0099085 A1 | 5/2007 | Choi et al. |
| 2007/0105017 A1 | 5/2007 | Kawase et al. |
| 2007/0117018 A1 | 5/2007 | Huggins |
| 2007/0122702 A1 | 5/2007 | Sung et al. |
| 2007/0148544 A1 | 6/2007 | Le |
| 2007/0172732 A1 | 7/2007 | Jung et al. |
| 2007/0184345 A1 | 8/2007 | Neudecker et al. |
| 2007/0190413 A1 | 8/2007 | Lee et al. |
| 2007/0202395 A1 | 8/2007 | Snyder et al. |
| 2007/0202402 A1 | 8/2007 | Asahina et al. |
| 2007/0207080 A1 | 9/2007 | Yang |
| 2007/0207385 A1 | 9/2007 | Liu et al. |
| 2007/0209584 A1 | 9/2007 | Kalynushkin et al. |
| 2007/0212538 A1 | 9/2007 | Niu |
| 2007/0218366 A1 | 9/2007 | Kalynushkin et al. |
| 2007/0224508 A1 | 9/2007 | Aramata et al. |
| 2007/0224513 A1 | 9/2007 | Kalynushkin et al. |
| 2007/0238021 A1 | 10/2007 | Liu et al. |
| 2007/0243469 A1 | 10/2007 | Kim et al. |
| 2007/0264564 A1 | 11/2007 | Johnson et al. |
| 2007/0264574 A1 | 11/2007 | Kim et al. |
| 2007/0269718 A1 | 11/2007 | Krause et al. |
| 2007/0277370 A1 | 12/2007 | Kalynushkin et al. |
| 2008/0003496 A1 | 1/2008 | Neudecker et al. |
| 2008/0003503 A1 | 1/2008 | Kawakami et al. |
| 2008/0020281 A1 | 1/2008 | Kogetsu et al. |
| 2008/0038638 A1 | 2/2008 | Zhang et al. |
| 2008/0090074 A1* | 4/2008 | Matsumura et al. .......... 428/338 |
| 2008/0090149 A1 | 4/2008 | Sano et al. |
| 2008/0096110 A1 | 4/2008 | Bito et al. |
| 2008/0107967 A1 | 5/2008 | Liu et al. |
| 2008/0113271 A1 | 5/2008 | Ueda et al. |
| 2008/0118834 A1 | 5/2008 | Yew et al. |
| 2008/0124631 A1 | 5/2008 | Fukui et al. |
| 2008/0131782 A1 | 6/2008 | Hagiwara et al. |
| 2008/0138710 A1 | 6/2008 | Liaw et al. |
| 2008/0138716 A1 | 6/2008 | Iwama et al. |
| 2008/0145752 A1 | 6/2008 | Hirose et al. |
| 2008/0145759 A1 | 6/2008 | Sung et al. |
| 2008/0160415 A1 | 7/2008 | Wakita et al. |
| 2008/0176139 A1 | 7/2008 | White et al. |
| 2008/0206631 A1 | 8/2008 | Christensen et al. |
| 2008/0206641 A1 | 8/2008 | Christensen et al. |
| 2008/0233479 A1 | 9/2008 | Sung et al. |
| 2008/0233480 A1 | 9/2008 | Sung et al. |
| 2008/0241647 A1 | 10/2008 | Fukui et al. |
| 2008/0241703 A1 | 10/2008 | Yamamoto et al. |
| 2008/0248250 A1 | 10/2008 | Flemming et al. |
| 2008/0261112 A1 | 10/2008 | Nagata et al. |
| 2008/0305391 A1 | 12/2008 | Hirose et al. |
| 2009/0053589 A1 | 2/2009 | Obrovac et al. |
| 2009/0078982 A1 | 3/2009 | Rachmady et al. |
| 2009/0087731 A1 | 4/2009 | Fukui et al. |
| 2009/0101865 A1 | 4/2009 | Matsubara et al. |
| 2009/0117466 A1 | 5/2009 | Zhamu |
| 2009/0186267 A1 | 7/2009 | Tiegs |
| 2009/0239151 A1 | 9/2009 | Nakanishi et al. |
| 2009/0253033 A1 | 10/2009 | Hirose et al. |
| 2009/0269677 A1 | 10/2009 | Hirose et al. |
| 2009/0305129 A1 | 12/2009 | Fukui et al. |
| 2010/0085685 A1 | 4/2010 | Pinwill |
| 2010/0092868 A1 | 4/2010 | Kim et al. |
| 2010/0092888 A1* | 4/2010 | Buchine et al. ............... 430/296 |
| 2010/0124707 A1 | 5/2010 | Hirose et al. |

(56) References Cited

U.S. PATENT DOCUMENTS

| | | | |
|---|---|---|---|
| 2010/0136437 | A1 | 6/2010 | Nishida et al. |
| 2010/0285358 | A1 | 11/2010 | Cui et al. |
| 2010/0297502 | A1 | 11/2010 | Zhu et al. |
| 2010/0330419 | A1 | 12/2010 | Cui et al. |

FOREIGN PATENT DOCUMENTS

| | | | |
|---|---|---|---|
| CN | 101442124 A | | 5/2009 |
| DE | 199 22 257 A1 | | 11/2000 |
| DE | 103 47 570 A1 | | 5/2005 |
| EP | 0 281 115 | | 9/1988 |
| EP | 0 553 465 A1 | | 8/1993 |
| EP | 0 820 110 A2 | | 1/1998 |
| EP | 1 011 160 A1 | | 6/2000 |
| EP | 0 936 687 B1 | | 12/2001 |
| EP | 1 231 653 A1 | | 8/2002 |
| EP | 1 231 654 A1 | | 8/2002 |
| EP | 1 258 937 A1 | | 11/2002 |
| EP | 1 083 614 B1 | | 5/2003 |
| EP | 1 313 158 A2 | | 5/2003 |
| EP | 1 335 438 A1 | | 8/2003 |
| EP | 1 289 045 B1 | | 3/2006 |
| EP | 1 657 769 A1 | | 5/2006 |
| EP | 1 850 409 A1 | | 10/2007 |
| EP | 1 771 899 B1 | | 2/2008 |
| EP | 1 657 768 B1 | | 5/2008 |
| EP | 2 058 882 | | 5/2009 |
| EP | 2 204 868 A3 | | 7/2010 |
| FR | 2 885 913 B1 | | 8/2007 |
| GB | 0 980 513 | | 1/1965 |
| GB | 1 014 706 | | 12/1965 |
| GB | 2 395 059 A | | 5/2004 |
| GB | 2 464 157 B | | 1/2010 |
| GB | 2 464 158 | | 4/2010 |
| JP | 02-209492 A | | 8/1990 |
| JP | 06-283156 | | 10/1994 |
| JP | 10-046366 | | 2/1998 |
| JP | 10-083817 | | 3/1998 |
| JP | 10-199524 | | 7/1998 |
| JP | 2000-003727 | | 1/2000 |
| JP | 2000-173594 | | 6/2000 |
| JP | 2000-348730 A | | 12/2000 |
| JP | 2001-291514 | | 10/2001 |
| JP | 2002-279974 A | | 9/2002 |
| JP | 2002-313319 A | | 10/2002 |
| JP | 2003-017040 | | 1/2003 |
| JP | 2003-168426 | | 6/2003 |
| JP | 04-607488 | | 2/2004 |
| JP | 2004-071305 | | 3/2004 |
| JP | 2004-095264 | | 3/2004 |
| JP | 2004-214054 | | 7/2004 |
| JP | 2004-281317 | | 10/2004 |
| JP | 2004-296386 A | | 10/2004 |
| JP | 2004-533699 A | | 11/2004 |
| JP | 2005-310759 A | | 11/2005 |
| JP | 2006-505901 A | | 2/2006 |
| JP | 2006-276214 A | | 10/2006 |
| JP | 2006-290938 A | | 10/2006 |
| JP | 2006-335410 A | | 12/2006 |
| JP | 2007080827 A | | 3/2007 |
| JP | 2007-165079 A | | 6/2007 |
| JP | 2008-034266 | | 2/2008 |
| JP | 2008-186732 | | 8/2008 |
| JP | 2008210618 A | | 9/2008 |
| JP | 2008-234988 | | 10/2008 |
| JP | 2008277000 A | | 11/2008 |
| JP | 2009523923 A | | 6/2009 |
| JP | 2009-252348 A | | 10/2009 |
| JP | 2010192444 A | | 9/2010 |
| JP | 5000787 B2 | | 8/2012 |
| JP | 2013510405 A | | 3/2013 |
| KR | 20050090218 A | | 9/2005 |
| KR | 2007-023141 | | 2/2007 |
| KR | 2007-0110569 A | | 11/2007 |
| KR | 2008-038806 A | | 5/2008 |
| NL | 1015956 | | 8/2000 |
| SU | 471402 | | 5/1975 |
| SU | 544019 | | 1/1977 |
| WO | WO 99/33129 | | 7/1999 |
| WO | WO 01/13414 A1 | | 2/2001 |
| WO | WO 01/35473 A1 | | 5/2001 |
| WO | WO 01/96847 A1 | | 12/2001 |
| WO | WO 02/25356 A2 | | 3/2002 |
| WO | WO 02/47185 A2 | | 6/2002 |
| WO | WO 03/063271 A1 | | 7/2003 |
| WO | WO 03/075372 A2 | | 9/2003 |
| WO | WO 2004/042851 A2 | | 5/2004 |
| WO | WO 2004/052489 A2 | | 6/2004 |
| WO | WO 2004/083490 A2 | | 9/2004 |
| WO | WO 2004/109839 A1 | | 12/2004 |
| WO | WO 2005/011030 A1 | | 2/2005 |
| WO | WO 2005/113467 A1 | | 12/2005 |
| WO | WO 2005/119753 A2 | | 12/2005 |
| WO | WO 2006/067891 A1 | | 6/2006 |
| WO | WO 2006/073427 A2 | | 7/2006 |
| WO | WO 2006/120332 A2 | | 11/2006 |
| WO | WO 2007/044315 A1 | | 4/2007 |
| WO | WO 2007/083152 A1 | | 7/2007 |
| WO | WO 2007/083155 | | 7/2007 |
| WO | WO 2007/114168 A1 | | 10/2007 |
| WO | WO 2007/136164 A1 | | 11/2007 |
| WO | WO 2008/029888 A1 | | 3/2008 |
| WO | WO 2008/044683 A1 | | 4/2008 |
| WO | WO 2008/072460 A1 | | 6/2008 |
| WO | WO 2008/097723 A1 | | 8/2008 |
| WO | WO 2008/139157 A1 | | 11/2008 |
| WO | WO 2009/010757 | | 1/2009 |
| WO | WO 2009/010758 | | 1/2009 |
| WO | WO 2009/010759 | | 1/2009 |
| WO | WO 2009/026466 | | 2/2009 |
| WO | WO 2009/120404 A1 | | 10/2009 |
| WO | WO 2009/128800 | | 10/2009 |
| WO | WO 2010/040985 | | 4/2010 |
| WO | WO 2010/040986 | | 4/2010 |
| WO | WO 2010/060348 A1 | | 6/2010 |
| WO | WO 2010/130975 A1 | | 11/2010 |
| WO | WO 2010/130976 A1 | | 11/2010 |

OTHER PUBLICATIONS

Barraclough et al., "Cold Compaction of Silicon Powders Without a Binding Agent", Materials Letters 61 (2007) 485-487.

Beaulieu et al., "Colossal Reversible Volumes Changes in Lithium Alloys", Electrochemical and Solid-State Letters, 4 (9) (2001) A137-A140.

Beaulieu et al., "Reaction of Li with Grain-Boundary Atoms in Nanostructured Compounds", Journal of the Electrochemical Society, 147 (9) (2000) 3206-3212.

Besenhard et al., "Will Advanced Lithium-Alloy Anodes Have a Chance in Lithium-Ion Batteries?", Journal of Power Sources, 68 (1997) 87-90.

Boukamp et al., "All-Solid Lithium Electrodes with Mixed-Conductor Matrix", J. Electrochem. Soc.: Electrochemical Science and Technology, vol. 128, No. 4, (1981) 725-729.

Bourderau, et al., "Amorphous Silicon as a Possible Anode Material for Li-Ion Batteries", Journal of Power Sources, 81-82 (1999) 233-236.

Canham, L. T., "Diffusion of Li IN Si", Properties of Silicon, EMIS Datareviews Series No. 4 (1987) 454-462.

Chan et al., "Surface Chemistry and Morphology of the Solid Electrolyte Interphase on Silicon Nanowire Lithium-Ion Battery Anodes", Journal of Power Sources, 189(2), 1132-1140, (2009).

Chang et al., "Ultrafast Growth of Single-Crystalline Si Nanowires", Materials Letters, 60 (2006) 2125-2128.

Chen et al., Binder Effect on Cycling Performance of Silicon/Carbon Composite Anodes for Lithium Ion Batteries, 36 (2006) 1099-1104.

Chen et al., "Effect of Vinylene Carbonate (VC) as Electrolyte Additive on Electrochemical Performance of Si Film Anode for Lithium Ion Batteries", Journal of Power Sources, 174(2), 538-543, (2007).

Chen et al., "Selective Etching of Silicon in Aqueous Ammonia Solution", Sensors and Actuators, A 49 (1995) 115-121.

(56) References Cited

OTHER PUBLICATIONS

Chevrier et al., "Methods for Successful Cycling of Alloy Negative Electrodes in Li-Ion Cells", 220th ECS Meeting, Abstract #1237 (2011).

Choi et al., "Effect of Fluoroethylene Carbonate Additive on Interfacial Properties of Silicon Thin-Film Electrode", Journal of Power Sources, 161(2), 1254-1259 (2006).

Colinge, Jean-Pierre, "Silicon-on-Insulator Technology: Materials to VLSI", Chapter 2, SOI Materials, (1991), Cover page and p. 38.

Deal et al., "General Relationship for the Thermal Oxidation of Silicon", Journal of Applied Physics, vol. 36, No. 12, (Dec. 1965) 3770-3778.

De Angelis et al., "Water Soluble Nanoporous Nanoparticles for In Vivo Targeted Drug Deliver and Controlled Release in B Cells Tumor Context", Nanoscale, 1020, vol. 2, p. 2230-2236.

El Ouatani et al., "The Effect of Vinylene Carbonate Additive on Surface Film Formation on Both Electrodes in Li-Ion Batteries", J. Electrochem. Soc., 156(2), A103-A113 (2009).

Feng et al., "Lithography-Free Silicon Micro-Pillars as Catalyst Supports for Microfabricated Fuel Cell Applications", Electrochemistry Communications, 8 (2006) 1235-1238.

Garrido, et al., The Role of Chemical Species in the Passivation of <100> Silicon Surfaces by HF in Water-Ethanol Solutions, J. Electrochem Soc., vol. 143, No. 12, 1996, p. 4059-4066.

Green et al., "Mesoscopic Hemisphere Arrays for use as Resist in Solid State Structure Fabrication", J. Vac. Sci. Technol. B 17(5) (1999) 2074-2083.

Green et al., "Quantum Pillar Structures on n+ Gallium Arsenide Fabricated Using "Natural" Lithography", Appl. Phys. Lett., 62 (3) (1993) 264-266.

Green et al., "Structured Silicon Anodes for Lithium Battery Applications", Electrochemical and Solid-State Letters, 6 (5) (2003) A75-A79.

Han et al., "Neutralized Poly (Acrylic Acid) as Polymer Binder for High Capacity Silicon Negative Electrodes", 220th ECS Meeting, Abstract #1250 (2011).

Heinze et al., "Viscosity Behaviour of Multivalent Metal Ion-Containing Carboxymethyl Cellulose Solutions", Die Angewandte Makromolekulare Chamie 220, 123-132, (Nr. 3848), (1994).

Hochgatterer et al., "Silicon/Graphite Composite Electrodes for High Capacity Anodes: Influence of Binder Chemistry on Cycling Stability", Electrochemical and Solid-State Letters, 11 (5) (2008) A76-A80.

Huggins, Robert A., "Lithium Alloy Anodes" in Handbook of Battery Materials, J.O. Besenhard Ed., Wiley-VCH, Weinheim, 361-381 (1999).

Ivanovskaya et al., "The Effect of Treatment of Cation-Selective Glass Electrodes With AgNO3 Solution on Electrode Properties", Sensors and Actuators B 24-25 (1995) 304-308.

Jianfeng et al., "Large-Scale Array of Highly Oriented Silicon-Rich Micro/Nanowires Induced by Gas Flow Steering", Solid State Communications, 133 (2005) 271-275.

Kasavajjula et al., "Nano- and Bulk-Silicon-Based Insertion Anodes for Lithium-Ion Secondary Cells", Journal of Power Sources, 163 (2007) 1003-1039.

Key to Metal Aluminum-Silicon Alloys, www.keytometals.com/Article80.

Kim et al., "(110) Silicon Etching for High Aspect Ratio Comb Structures", 1997 6th International Conference on Emerging Technologies and Factory Automation Proceedings, (1997) 248-252.

Kim et al., "Improvement of Silicon Powder Negative Electrodes by Copper Electroless Deposition for Lithium Secondary Batteries", Journal of Power Sources, 147 (2005) 227-233.

Kleimann et al., "Formation of Wide and Deep Pores in Silicon by Electrochemical Etching", Materials Science and Engineering, B69-70 (2000) 29-33.

Kolasinski, Kurt W., "Silicon Nanostructures from Electroless Electrochemical Etching", Current Opinion in Solid State and Materials Science, 9 (2005) 73-83.

Komba et al., "Functional Interface of Polymer Modified Graphite Anode", Journal of Power Sources, 189, (2009), 197-203.

Komba et al., "Polyacrylate as Functional Binder for Silicon and Grapite Composite Electrode in Lithium-Ion Batteries", Electrochemistry, 79(1), (2010), 6-9.

Komba et al., "Polyacrylate Modifier for Graphite Anode of Lithium-Ion Batteries", Electrochemical and Solid-State Letters, 12(5), (2009), A107-A110.

Komba et al., "Study on Polymer Binders for High-Capacity SiO Negative Electrode of Li-Ion Batteries", Journal of Physical Chemistry, 115, (2011), 13487-13495.

Lang, Walter, "Silicon Microstructuring Technology", Materials Science and Engineering, R17 (1996) 1-55.

Lee et al., "Effect of Poly (Acrylic Acid) on Adhesion Strength and Electrochemical Performance of Natural Graphite Negative Electrode for Lithium-Ion Batteries", Journal of Power Sources, 161(1), (2006), 612-616.

Li et al., "A High Capacity Nano-Si Composite Anode Material for Lithium Rechargeable Batteries", Electrochemical and Solid-State Letters, 2 (11) (1999) 547-549.

Li et al., "Sodium Carboxymethyl Cellulose: a Potential Binder for Si Negative Electrodes for Li-Ion Batteries", Electrochemical and Solid-State Letters, 10(2) (2007), A17-A20.

Li et al., "The Crystal Structural Evolution of Nano-Si Anode Caused by Lithium Insertion and Extraction at Room Temperature", Solid State Ionics, 135 (2000) 181-191.

Liu et al., "A Novel Method of Fabricating Porous Silicon Material: Ultrasonically Enhanced Anodic Electrochemical Etching", Solid State Communications, 127 (2003) 583-588.

Liu et al., "Effect of Electrode Structure on Performance of Si Anode in Li-Ion Batteries: Si Particle Size and Conductive Additive", Journal of Power Source, 140 (2005) 139-144.

Liu et al., "Enhanced Cycle Life of Si Anode for Li-Ion Batteries by Using Modified Elastomeric Binder", Electrochemical and Solid-State Letters, 8(2) (2005), A100-A103.

Lu et al., "A Study of the Mechanisms of Erosion in Silicon Single Crystals Using Hertzian Fracture Tests", Wear, 186-187 (1995) 105-116.

Maranchi et al., "Interfacial Properties of the a-Si/Cu: Active-Inactive Thin-Film Anode Systems for Lithium-Ion Batteries", Journal of the Electrochemical Society: 153 (6) (2006) A1246-A1253.

Nakahata et al., "Fabrication of Lotus-Type Porous Silicon by Unidirectional Solidification in Hyrdogen", Materials Science and Engineering A 384 (2004) 373-376.

Niparko, J.K. (Editor), "Cochlear Implant Technology", Pub., Lippincott Williams and Wilkins, Philadelphia, (2000) 108-121.

Obrovac et al., "Structural Changes in Silicon Anodes During Lithium Insertion/Extraction", Electrochemical and Solid-State Letters, 7(5), (2004), A96-A96.

Ohara et al., "A Thin Film Silicon Anode for Li-Ion Batteries Having a Very Large Specific Capacity and Long Cycle Life", Journal of Power Sources, 136 (2004) 303-306.

Pei et al., "Silicon Nanowires Grown from Silicon Monoxide Under Hydrothermal Conditions", Journal of Crystal Growth, 289 (2006) 423-427.

Peng et al., "Dendrite-Assisted Growth of Silicon Nanowires in Electroless Metal Deposition", Adv. Funct. Mater., 13, No. 2 (2003) 127-132.

Peng et al., "Fabrication of Large-Area Silicon Nanowire p-n. Junction Diode Arrays", Adv. Mater. (2004), vol. 16, No. 1, 73-76.

Peng et al., "Silicon Nanowires for Rechargeable Lithium-ion Battery Anodes", Applied Physics Letters (2008) vol. 93, No. 3, pp. 33105-1 to 33105-3.

Peng et al., "Simultaneous Gold Deposition and Formation of Silicon Nanowire Arrays", Journal of Electroanalytical Chemistry, 558 (2003) 35-39.

Peng et al., "Synthesis of Large-Area Silicon Nanowire Arrays via Self-Assembling Nanoelectrochemistry", Adv. Mater., 14, No. 16 (2002) 1164-1167.

Peng et al., "Uniform, Axial-Orientation Alignment of One-Dimensional Single-Crystal Silicon Nanostructure Arrays", Angew. Chem. Ind. Ed., 44 (2005) 2737-2742.

(56) References Cited

OTHER PUBLICATIONS

Peng, et al., "Fabrication of Single-Crystalline Silicon Nanowires by Scratching a Silicon Surface with Catalytic Metal Particles", Adv. Funct. Mater., 16 (2006), 387-394.
Qiu et al., "From Si Nanotubes to Nanowires: Synthesis, Characterization, and Self Assembly", Journal of Crystal Growth, 277 (2005) 143-148.
Qiu et al., "Self-Assembled Growth and Optical Emission of Silver-Capped Silicon Nanowires", Applied Physics Letters, vol. 84, No. 19, (2004) 3867-3869.
Russo, et al., "A Mechanical Approach to Porous Silicon Nanoparticles Fabrication", Materials 2011, vol. 4, p. 1023-1033.
Sharma et al., "Thermodynamic Properties of the Lithium-Silicon System", J. Electrochem. Soc.: Electrochemical Science and Technology, vol. 123 (1976) 1763-1768.
Shin et al., "Porous Silicon Negative Electrodes for Rechargeable Lithium Batteries", Journal of Power Sources, 139 (2005) 314-320.
Sugama, et al., "Nature of Interfacial Interaction Mechanisms Between Polyacrylic Acid Macromolecules and Oxide Metal Surfaces", Journal of Materials Science, 19 (1984) 4045-4056.
Takami et al., "Silicon Fiber Formed on Silicon Without Using a Gas Process", Journal of Applied Physics, vol. 91, No. 12, 2-5 (2002).
Tokoro et al., "Anisotropic Etching Properties of Silicon in KOH and TMAH Solutions", Proceedings of the 1998 International Symposium on Micromechatronics and Human Science (1998) 65-70.
Tsuchiya et al., "Structural Fabrication Using Cesium Chloride Island Arrays as a Resist in a Fluorocarbon Reactive Ion Etching Plasma", Electrochemical and Solid-State Letters, 3 (1) (2000) 44-46.
Ui et al., "Improvement of Electrochemical Characteristics of Natural Graphite Negative Electrode Coated With Polyacrylic Acid in Pure Propylene Carbonate Electrolyte", Journal of Power Sources, 173(1), (2007), 518-521.
Wagner et al., "Vapor-Liquid-Solid Mechanism of Single Crystal Growth", Applied Physics Letters, vol. 4, No. 5 (1964) 89-90.
Wen et al., "Chemical Diffusion in Intermediate Phases in the Lithium-Silicon System", Journal of Solid State Chemistry, 37 (1981) 271-278.
Weydanz et al., "A Room Temperature Study of the Binary Lithium-Silicon and the Ternary Lithium-Chromium-Silicon System for use in Rechargeable Lithium Batteries", Journal of Power Sources, 81-82 (1999) 237-242.
Winter, et al., "Insertion Electrode Materials for Rechargeable Lithium Batteries", Advanced Materials, 1998, 10, No. 10.
Wong et al., "Controlled Growth of Silicon Nanowires Synthesized Via Solid-Liquid-Solid Mechanism", Science and Technology of Advanced Materials, 6 (2005) 330-334.
Yabuuchi et al., "Graphite-Silicon-Polyacrylate Negative Electrodes in Ionic Liquid Electrolyte for Safer Rechargeable Li-Ion Batteries", Advanced Energy Materials, 1, (2011), 759-765.
Yan et al., "Growth of Amorphous Silicon Nanowires via a Solid-Liquid-Solid Mechanism", Chemical Physics Letters, 323 (2000) 224-228.
Yan et al., "H2-Assisted Control Growth of Si Nanowires", Journal of Crystal Growth, 257 (2003) 69-74.
Ye et al., Controllable Growth of Silver Nanostructures by a Simple Replacement Reaction and Their SERS Studies, Solid State Sciences 11 (2009), p. 1088-1093.
Yoshio et al., "Electrochemical Behaviors of Silicon Based Anode Material", Journal of Power Sources, 153 (2006) 375-379.
Zhang et al., "A Review on Electrolyte Additives for Lithium-Ion Batteries", Journal of Power Sources, 162(2), 1379-1394, (2006).
Zhang et al., "Bulk-Quantity Si Nanowires Synthesized by SiO Sublimation", Journal of Crystal Growth, 212 (2000) 115-118.
Zhang et al., "Catalytic Growth of $^x$-FiSi$_2$ and Silicon Nanowires", Journal of Crystal Growth, 280 (2005) 286-291.
Zhang et al., "Synthesis of Thin Si Whiskers (Nanowires) Using SiCl$_4$", Journal of Crystal Growth, 2006 (2001) 185-191.
United Kingdom Search Report dated Aug. 6, 2010 for App. No. GB1005979.8.
International Search Report dated Dec. 8, 2011 for App. PCT/GB2011/000546.
Written Opinion dated Dec. 8, 2011 for App. PCT/GB2011/000546.
Peng, K. et al., "Metal-Particle-Induced, Highly Localized Site-Specific Etching of Si and Formation of Single-Crystalline Si Nanowires in Aqueous Fluoride Solution", Chemistry A European Journal 2006, 12, pp. 7942-7947 (2006).

\* cited by examiner

METHOD OF FABRICATING STRUCTURED PARTICLES COMPOSED OF SILICON OR SILICON-BASED MATERIAL AND THEIR USE IN LITHIUM RECHARGEABLE BATTERIES

TECHNICAL FIELD

The invention relates to a process of fabricating a silicon-containing material such as a silicon wafer or a silicon particle through a surface etching technique to form pillars thereon; a method of forming silicon fibres by detaching the pillars so formed from the underlying material; an electrode containing such particles and/or fibres as its active material and devices comprising such fibres and particles, such as an electrochemical cell, solar capacitor or cell, fuel cells, sensors or filters.

BACKGROUND ART

The recent increase in the use of portable electronic devices such as mobile telephones and notebook computers and the emerging trend of using rechargeable batteries in hybrid electric vehicles has created a need for smaller, lighter, longer lasting rechargeable batteries to provide the power to devices such as these. During the 1990s, lithium rechargeable batteries, specifically lithium-ion batteries, became popular and, in terms of units sold, now dominate the portable electronics marketplace and are set to be applied to new, cost sensitive applications. However, as more and more power hungry functions are added to the above mentioned devices (e.g. cameras on mobile phones), improved and lower cost batteries that store more energy per unit mass and per unit volume are required.

The basic composition of a conventional lithium-ion rechargeable battery cell including a graphite-based anode electrode is shown in FIG. 1. The battery cell includes a single cell but may also include more than one cell.

The battery cell generally comprises a copper current collector for the negative electrode (or anode) 10 and an aluminium current collector for the positive electrode (or cathode) 12 which are both externally connectable to a load or to a recharging source as appropriate. A graphite-based composite anode layer 14 overlays the current collector 10 and a lithium containing metal oxide-based composite cathode layer 16 overlays the current collector 12. A porous plastic spacer or separator 20 is provided between the graphite-based composite anode layer 14 and the lithium containing metal oxide-based composite cathode layer 16. A liquid electrolyte material is dispersed within the porous plastic spacer or separator 20, the composite anode layer 14 and the composite cathode layer 16. In some cases, the porous plastic spacer or separator 20 may be replaced by a polymer electrolyte material and in such cases the polymer electrolyte material is present within both the composite anode layer 14 and the composite cathode layer 16. The polymer electrolyte material can be a solid polymer electrolyte or a gel-type polymer electrolyte and can incorporate a separator. The electrodes are referred to as an anode or cathode based upon their function during discharge of the cell, when current is supplied through a load. This means that the negative electrode is referred to as the anode and the positive electrode is referred to as the cathode. However, as known in the art, in a rechargeable cell each electrode can function as both an anode and a cathode, depending on whether the cell is being charged or discharged.

When the battery cell is fully charged, lithium has been transported from the lithium containing metal oxide cathode layer 16 via the electrolyte into the graphite-based anode layer 14 where it reacts with the graphite to create the compound, $LiC_6$. The graphite, being the electrochemically active material in the composite anode layer, has a maximum capacity of 372 mAh/g. It will be noted that the terms "anode" and "cathode" are used in the sense that the battery is placed across a load.

It is well known that silicon can be used as the active anode material of a rechargeable lithium-ion electrochemical battery cell (see, for example, Insertion Electrode Materials for Rechargeable Lithium Batteries, M. Winter, J. O. Besenhard, M. E. Spahr, and P. Novak in Adv. Mater. 1998, 10, No. 10). It is generally believed that silicon, when used as an active anode material in a lithium-ion rechargeable cell, can provide a significantly higher capacity than the currently used graphite. Crystalline silicon, when converted to the compound $Li_{22}Si_5$ by reaction with lithium in an electrochemical cell, has a maximum theoretical capacity of between 4000 and 4,200 mAh/g, considerably higher than the maximum capacity for graphite. Thus, if graphite can be replaced by silicon in a lithium rechargeable battery the desired increase in stored energy per unit mass and per unit volume can be achieved.

Many existing approaches of using a silicon or silicon-based active anode material in a lithium-ion electrochemical cell, however, have failed to show sustained capacity over the required number of charge/discharge cycles and are thus not commercially viable.

One approach disclosed in the art uses silicon in the form of a powder having particles with a diameter of 10 μm in some instances made into a composite with or without an electronic additive and containing an appropriate binder such as polyvinylidene difluoride; this anode material is coated onto a copper current collector. However, this electrode system fails to show sustained capacity when subjected to repeated charge/discharge cycles. It is believed that this capacity loss is due to partial mechanical isolation of the silicon powder mass arising from the volumetric expansion/contraction associated with lithium insertion/extraction to and from the host silicon. In turn this gives rise to electrical isolation of the silicon particles from both the copper current collector and each other. In addition, the volumetric expansion/contraction causes the individual particles to be broken up causing a loss of electrical contact within the spherical element itself.

Another approach known in the art designed to deal with the problem of the large volume changes during successive cycles is to make the size of the silicon particles that make up the silicon powder very small, i.e. in the 1-10 nm range. This strategy does not prevent the electrical isolation of the spherical elements from both the copper current collector and themselves as the silicon powder undergoes the volumetric expansion/contraction associated with lithium insertion/extraction. Importantly, the large surface area of the nano-sized elements can give rise to the creation of a lithium-containing surface film that introduces a large irreversible capacity into the lithium-ion battery cell. In addition, the large number of small silicon particles creates a large number of particle-to-particle contacts for a given mass of silicon and these each have a contact resistance and may thus cause the electrical resistance of the silicon mass to be too high. Furthermore, nano-sized particles tend to agglomerate into larger particles, making preparation of uniform electrode composites difficult.

The above problems have thus prevented silicon particles from becoming a commercially viable replacement for graphite in lithium rechargeable batteries and specifically lithium-ion batteries.

In another approach described by Ohara et al. in Journal of Power Sources 136 (2004) 303-306 silicon is evaporated onto a nickel foil current collector as a thin film and this structure is then used to form the anode of a lithium-ion cell. However, although this approach gives good capacity retention, this is only the case for very thin films (say ~50 nm) and thus these electrode structures do not give usable amounts of capacity per unit area.

A review of nano- and bulk-silicon-based insertion anodes for lithium-ion secondary cells has been provided by Kasavajjula et al (J. Power Sources (2006), doi:10.1016/jpowsour.2006.09.84), herewith incorporated by reference herein.

Another approach described in UK Patent Application GB2395059A uses a silicon electrode comprising a regular or irregular array of silicon pillars fabricated on a silicon substrate. These structured silicon electrodes show good capacity retention when subjected to repeated charge/discharge cycles and this good capacity retention is considered by the present inventors to be due to the ability of the silicon pillars to absorb the volumetric expansion/contraction associated with lithium insertion/extraction from the host silicon without the pillars being broken up or destroyed. However, the structured silicon electrodes described in the above publication are fabricated using a high purity, single crystal silicon wafer and hence the electrode is expensive.

Selective etching of silicon-based materials to create silicon pillars is also known from U.S. Pat. No. 7,033,936. The pillars of this document are fabricated by depositing hemispherical islands of caesium chloride or silicon dioxide on a crystalline silicon substrate to form a mask surface, covering the substrate surface, including the islands, with a film, and removing the hemispherical structures (including the film covering them) from the surface to form a further mask having exposed areas where the hemispheres had been. The substrate is then etched in the exposed areas using reactive ion etching and the resist is removed, e.g. by physical sputtering, to leave an array of silicon pillars in the unetched regions, i.e. in the regions between the locations of the hemispheres attached to the silicon base.

An alternative chemical method for fabricating silicon pillars or nano-wires is described by Peng K-Q, Yan, Y-J, Gao S-P, and Zhu J., Adv. Materials, 14 (2002), 1164-1167, Adv. Functional Materials, (2003), 13, No 2 February, 127-132 and Adv. Materials, 16 (2004), 73-76. According to the method of Peng, et al. a single silicon wafer (which may be n- or p-type and has the $\{111\}$ face exposed to solution) is etched at 50° C. using the following solution: 5M HF and 20 mM (0.02M) $AgNO_3$. The mechanism postulated in these papers is that isolated nanoclusters of silver are electrolessly deposited on the silicon surface in an initial stage (nucleation). In a second (etching) stage, the silver nanoclusters and the areas of silicon surrounding them act as local electrodes that cause the electrolytic oxidation of the silicon in the areas surrounding the silver nanoclusters to form $SiF_6$ cations, which diffuse away from the etching site to leave the silicon underlying the silver nanocluster in the form pillars.

K. Peng et al., Angew. Chem. Int. Ed., 44 (2005), 2737-2742; and K. Peng et al., Adv. Funct. Mater., 16 (2006), 387-394, describe a method of etching a single silicon wafer that is similar to that described in the earlier papers by Peng et al but the nucleation/silver nanoparticle deposition step and the etching step are performed in different solutions. In a first (nucleation) step, a silicon chip is placed in a solution of 4.6M HF and 0.01M $AgNO_3$ for 1 minute. A second (etching) step is then performed in a different solution, namely 4.6M HF and 0.135M $Fe(NO_3)_3$ for 30 or 50 minutes. Both steps are carried out at 50° C. In these papers, a different mechanism is proposed for the etching step as compared to the earlier papers, namely that silicon underlying the silver (Ag) nanoparticles are removed and the nanoparticles gradually sink into the bulk silicon, leaving columns of silicon in the areas that are not directly underlying the silver nanoparticles.

In order to increase the uniformity and density of the pillars grown on silicon wafers and the speed of growth, it has been proposed in WO2007/083152 to conduct the process in the presence of an alcohol.

Indeed, Gamido et al, J. Electrochem. Soc. 143(12) 1996 describes the superior behaviour of HF/ethanol mixtures in the etching of silicon substrates.

It will be appreciated that each of these documents referred to above discloses methods of fabricating silicon pillars or fibres on silicon wafers or chips. Wafers or chips are generally expensive to make, which means that any fibres or wires fabricated there from have a high intrinsic cost.

WO2009/010758 discloses the etching of silicon powder instead of wafers, in order to make silicon material for use in lithium ion batteries. The resulting etched particles, an example of which is shown in FIG. 2, contain pillars on their surface and the whole of the resulting particles can be used as an anode material. Alternatively, the pillars can be severed from the particles to form silicon fibres and only the silicon fibres are used to make the anode. The etching method used is the same as that disclosed in WO2007/083152.

PCT/GB2009/002348 discloses a further method that can be used to fabricate silicon pillars from both highly pure and lower grade (for example, metallurgical grade) silicon materials such as particulate or granular silicon. The method involves treating the silicon material with a solution comprising 5 to 10M hydrofluoric acid (HF), 0.01 to 0.1M silver ions ($Ag^+$), 0.02 to 0.2M nitrate ions ($NO_3^-$) and adding further nitrate ions to maintain the concentration of nitrate ions within the range specified during the treatment. The silicon particles are used in an amount in excess of 6 g of silicon per liter of etching solution.

Pillar arrays or detached silicon fibres have also been used in the fabrication of fuel cells, filters, sensors, field emitting diodes, chromatographic materials, solar capacitors, solar cells and electrical capacitors amongst other applications.

A problem with the methods disclosed in PCT/GB2009/002348 and WO2007/083152 and the other documents referred to herein above, is that the etching solution employs a high concentration of hydrofluoric acid (HF). Although a high fluoride concentration is believed to be essential for the etching step, a disadvantage of using such high concentrations of HF include the complications associated with recycling the excess HF left in the etchant solution after removal of the etched silicon material. Hydrogen fluoride is a highly corrosive material. The safety requirements associated with the handling of this material are complex and considerable. If the process involves the formation of insoluble salts of $SiF_6^{2-}$ the deposition of these salts may also contaminate the final product. The process of recycling the waste etchant is therefore both complex and costly. These cost implications have generally been ignored to date because of the belief in the field that a relatively high HF concentration is necessary if good quality pillars or fibres are to be produced. Indeed previous attempts to use lower concentrations of HF have resulted in very slow etch rates, wastage of the etching solution and poor quality silicon pillars or fibres.

The system parameters used to etch silicon-containing material such as silicon granules or powder have been found to be very different to those used for the etching of silicon wafers. Granules and powders have a much greater surface area than a silicon wafer of the same volume and tend to react more vigorously with an etching solution as a result. The rate of etching will, of course, depend upon the size and surface area of the silicon-containing particles being etched. It has been found, for example, that etching systems containing a high concentration of HF and a large quantity of silicon in the form of a granular or particulate material are liable to generate a considerable amount of heat and gas, which means that the system may be difficult to control and may result in an etched product containing silicon pillars that are fused together. Further, if the relative proportion of etching ingredients is incorrectly determined, excessive hydrogen gas may be generated and trapped at the surface of the silver nucleated silicon material thereby reducing access of the etching solution to the silicon surface and the extent to which the silicon surface can be etched. Finally it has been observed that if the HF concentration is too high, etching may proceed in both a vertical and a transverse direction, which may cause the pillars to become prematurely detached from the silicon surface. There is a need, therefore, for an etching system that can be used to efficiently etch the surface of a silicon powder or granule to give an etched silicon-containing product including on its surface an array of evenly distributed, well defined silicon-containing pillars having a uniform distribution of lengths and diameters.

There is a further need for an etching method, which reduces the safety, handling and cost issues associated with the use of etchant solutions comprising high concentrations of hydrogen fluoride but which is also able to produce silicon pillars or fibres of acceptable quality. The present invention addresses that problem.

DISCLOSURE OF THE INVENTION

It has been surprisingly found by the present inventors that it is possible to fabricate silicon pillars or fibres of acceptable quality on silicon material such as silicon wafers and silicon containing particles and granules by using solutions comprising concentrations of HF that are lower than those that have been previously used. A first aspect of the invention accordingly provides a process for treating silicon comprising the steps:
exposing silicon-containing material to a solution comprising:
0.01 to 5M HF
0.002 to 0.2M of metal ions capable of nucleating on and forming a porous layer comprising regions of elemental metal on the silicon surface;
0.001 to 0.7M of an oxidant selected from the group comprising $O_2$, $O_3$, $H_2O_2$, the acid, ammonium or alkali metal salt of $NO_3^-$, $S_2O_8^{2-}$, $NO_2^-$, $B_4O_7^{2-}$ or $ClO_4^-$ or a mixture thereof. The treated silicon is suitably separated from the solution after the treatment. Preferably the silicon material is powdered silicon.

The process of the first aspect of the invention can be used in a process for etching silicon-containing material such as a silicon wafer or silicon-containing powder particles and granules to give silicon-containing pillared particles. The term pillar should be understood to mean an elongate structure selected from but not limited to the group comprising rods, columns, nanowires, tubes, fibres, ribbons and flakes and these terms may be used interchangeably herein. A pillar can have a uniform or non-uniform cross section along its length and a circular or non-circular cross-section and can comprise a clump of elongate structures fused or combined together. The diameter or width of a pillar can vary along its length. The pillar can be formed upright or at an angle to a substrate and can have a kink or one or more changes of direction along its length, for example it can form a zig-zag or spiral shape. Pillars can have smooth or rough surfaces and can be micro or macro porous. The term pillared particle should be understood to mean a particle, wafer, chip, granule or other substrate material with a plurality of pillars attached to or formed on one or more of its surfaces and extending therefrom. The pillars can be arranged as a regular or irregular array, an ordered pattern or in a scattered, random distribution. Silicon-containing fibres can be isolated from the pillared particles and the term "fibre" should be understood to include but is not limited to structures selected from the group of rods, ribbons, threads, tubes and wires and these terms may be used interchangeably herein.

By the term silicon-containing material it should be understood to include wafers, chips, fragments, granules and particles that are formed from or contain silicon metal having a purity in the range 90.00% or over by mass, preferably 98.00% or over and especially 99.0% to 99.99%. The term also extends to silicon alloys, which include within their structure regions of silicon having these purity levels.

By the term silicon powder, it should be understood to mean a granular or particulate silicon-containing material having a principle diameter of greater than 1 μm. The terms powder particles and granules should be understood to include but not be limited to chips and fragments derived from the grinding or fragmentation of silicon-containing wafers. Suitably the silicon-containing material of the powder has a principle diameter of less than 1.5 mm. The silicon-containing granules or particles used as starting materials in the process of the present invention typically have a principle diameter in the range 1 μm to 1.5 mm and preferably 3 μm to 800 μm. Where the process according to the present invention is used to manufacture pillared particles the silicon containing particles or granules preferably have a principal diameter in the range 1 to 100 μm, preferably 3 to 50 μm, more preferably 10 to 50 μm, most preferably 20 to 40 μm and especially 15 μm to 25 μm. Where the process of the first aspect of the invention is used to manufacture detached silicon-containing fibres, the particles or granules have a principal diameter of up to 1.5 mm. Silicon containing fibres are most easily (but not exclusively) prepared from particles or granules having a principal diameter in the range 100 um to 1.5 mm, preferably 100 um to 1 mm, more preferably 100 um to 800 um and especially 200 um to 500 um. Particles or granules having a principal diameter of less than 100 um can be used to manufacture pillars or fibres, where appropriate. The particles or granules may be spherical or non-spherical in shape. Examples of non-spherical particles or granules include, but are not limited to, cuboidal, prismatic, tetrahedral, octahedral, decahedral and dodecahedral structures.

The treating solution suitably comprises HF at a concentration of 0.01 to 5M, preferably 0.1 to 4M, more preferably 0.25 to 5M, most preferably 0.25 to 4M, especially 2 to 4M and more especially 2 to 3M.

The process of the first aspect of the invention comprises a nucleation step in which a porous metal layer or mat is deposited on the surface of the silicon (the substrate) and an etching step in which the silicon material underlying the nucleated metal layer or mat is removed to give a silicon based substrate having silicon containing pillars or fibres extending there from.

The nucleation step requires the use of a solution comprising hydrogen ions and the use of a solution comprising a metal ion capable of being reduced to form a porous metal layer or mat on the silicon surface. An oxidant may be present. The concentration of hydrogen ions in the nucleation solution is not particularly important but must be sufficient to remove all native oxides from the silicon surface to facilitate deposition of the metal species thereon. The solution comprising a metal ion capable of being reduced on the silicon surface may be provided separately to the solution comprising hydrogen ions providing oxide formation on the surface of the silicon can be prevented. Preferably the hydrogen ions and the metal ions are provided in a single solution. Nucleation suitably requires the use of a solution comprising at least 0.01M $H^+$ and especially at least 0.5M $H^+$. The hydrogen ion is most suitably provided in the form of HF. The metal ion capable of being reduced to form a porous metal layer is suitably present in the solution at a concentration in the range 0.002 to 0.2M, preferably 0.01 to 0.15M. Although not essential, it is preferred that the nucleation solution includes an oxidant; this is suitably present at a concentration in the range 0.002 to 0.004M. Oxidant concentrations in the range 0.02 to 0.7M may also be used, but are less preferred for the nucleation step.

The etching step suitably requires a solution comprising HF and an oxidant selected from the group comprising $O_2$, $O_3$, $H_2O_2$, the acid, ammonium or alkali metal salt of $NO_3^-$, $S_2O_8^{2-}$, $NO_2^-$, $B_4O_7^{2-}$ or $ClO_4^-$ or a mixture thereof. The rate of etching will depend, in part, on the concentration of HF and the nature and concentration of the oxidant. If the oxidant concentration is too high or if the oxidant is too strong, the rate of etching may be too fast. Controlled etching is suitably achieved through the use of an etching solution comprising 0.001 to 0.7M, preferably 0.01 to 0.7M, more preferably 0.02 to 0.7M of an oxidant or mixture of oxidants referred to above and 0.1 to 5M HF, more preferably 0.25 to 5M HF, most preferably 0.25 to 4 M HF. Alternatively the etching solution comprises, in addition to HF, 0.003 to 0.7M of an oxidant or mixture of oxidants referred to above, more preferably 0.01 to 0.7M, most preferably 0.04 to 0.5M and especially 0.04 to 0.07M.

For a fixed silicon loading and particle size, optimal etching of the silicon surface may be achieved through controlled addition of one or more components of the etching solution to the reaction chamber during the etching step. It may be necessary to control one or both of the HF concentration and/or the oxidant concentration during the etching step and this is best achieved by monitoring the concentration of the HF and or the oxidant and adding further HF and/or oxidant to the reaction mixture during the etching step to maintain the concentration of the HF and/or oxidant within a specified concentration range. Optimal etching of the silicon material is suitably achieved by maintaining the concentration of the oxidant within the concentration range specified herein above during the etching step. The oxidant concentration is preferably maintained through the addition of oxidant species to the etching solution; this can be achieved by adding the oxidant species to the solution in one or more steps or by continual addition.

Preferred oxidants include the acid, ammonium or alkali metal salt of $NO_3^-$, $H_2O_2$, $O_2$, and $O_3$. The acid, ammonium or alkali metals salts of $NO_3^-$ ions are especially preferred. The nitrate ion is suitably derived from one or more of an alkali metal nitrate salt, an ammonium nitrate salt or nitric acid. Alkali metal nitrate salts and ammonium nitrates are especially preferred sources of nitrate ions.

The rate of etching is also influenced by the concentration or amount of silicon material per unit volume of etching solution (herein after referred to as the silicon loading). The etching rate and pillar quality will be affected by both the silicon loading and by the size and consequently surface area of silicon particles. It has been observed that the rate of etching tends to be proportional to the surface area of silicon material up to a loading maximum that depends on the particle size for a fixed volume of the silicon material being etched. Once the silicon loading exceeds a certain value, mass transport effects interfere with the rate at which etchant species arrive at and leave a silicon surface, which reduces the etching efficiency and results in the formation of poor quality pillars. The optimal silicon loading for any one system will depend on the concentration of the etching species (oxidant and HF) as well as the size of the silicon particles being etched and an optimum silicon loading can be readily determined through the use of methods known to a skilled person.

It has been observed that the silicon loading in the treatment solution can strongly affect the nature of the product formed. If the silicon loading is too high, the silicon-containing pillars formed are of a poor quality. Additionally, if the silicon surface area is high, a high HF concentration must be avoided to prevent the rate of etching from proceeding too rapidly. The optimal silicon loading for a particular concentration of HF will depend, in part, upon the particle size. Silicon loadings of between 2 and 60 g/l have been found to give products having acceptable pillar and/or fibre quality. Depending on the size and surface area of particles being treated and the HF/Oxidant concentrations used, higher loadings may be possible. For particles or granules having an average principle diameter of the order of 25 µm, pillars and pillared particles of acceptable quality can be obtained by loading silicon at a level of 15 to 40 g/l in a treating solution having an HF concentration of 7.5M. We have found that the best results have been obtained by using 1 to 10 g, suitably 2 to 8 g and preferably 4 to 8 g of silicon granules of dimensions 15 to 25 µm for every liter of etching solution having an HF concentration in the range 2 to 3.5M. Using HF etching solutions having a concentration in the range 2 to 3.5M, silicon loadings of 4 to 8 g/l for particle sizes in the range 15 to 25 µm have been found to give acceptable results. For silicon particles or granules having an average principle diameter of 12 µm, acceptable results can be obtained using a silicon loading in the range 15 to 20 g/l. A silicon loading of 7 to 10 g/l can be used for silicon particles having an average principle diameter of 6 µm. A silicon loading of between 2 and 8 g/l has been used for silicon particles or granules having an average principle diameter of between 200 and 800 µm. Preferably the silicon loading is at least 1 g/l, more preferably at least 2 g/l, most preferably at least 4 g/l, especially at least 8 g/l. Suitable maximum limits on silicon loading are no more than 500 g/l, more suitably no more than 100 g/l, especially no more than 80 g/l.

It will be appreciated from the foregoing that for a fixed silicon loading and particle size, the nature of the product of the treatment process of the first aspect of the invention will depend upon the concentration in which the individual components (HF, metal ions and oxidant) are present in the solution. If the treating solution contains a relatively high concentration of metal ions and a lower concentration of oxidant, the product of the process will generally be in the form of nucleated silicon/silver particles or granules having a minimally etched surface. If the treating solution contains a relatively high concentration of HF and oxidant, the product of the process will generally be in the form of an etched silicon particle or granule.

As indicated above, the metal ions provided by the treating solution must be able to form a porous film or mat on the surface of the silicon during nucleation. Without wishing to be constrained by theory, it is believed that the formation of etched silicon pillars can only be achieved through the formation of a porous film during nucleation; the porous metal film or mat is believed to catalyse the etching step causing the silicon material underneath the nucleated metal to be etched away more rapidly than the exposed silicon material adjacent thereto, resulting in the formation of silicon pillars on the substrate surface.

The nucleating metal ions provided in the treating solution are able to form a porous mat over the surface of the silicon to be etched. The formation of a dendritic mat is especially preferred. Examples of metals ions that are able to form porous films on the silicon surface upon nucleation include silver, gold, platinum, copper, nickel, lead, cobalt, cadmium, chromium, zinc and tin and mixtures thereof. Where a mixture of metal ions are used it is preferable (although not essential) to use metal ions having similar redox potentials. Metal ions such as silver, gold, platinum and tin are preferred. Solutions containing silver ions are especially preferred as silver ions are able to form a dendritic mat or layer over the surface of the silicon to be etched on nucleation.

A first preferred embodiment according to the first aspect of the invention provides a process for treating silicon comprising the steps of exposing silicon powder to a solution comprising:
0.01 to 5M HF
0.002 to 0.2M $Ag^+$ ions
0.001 to 0.7M $NO_3^-$ ions derived from nitric acid, ammonium nitrate and an alkali metal nitrate. The treated silicon is suitably separated from the solution. Preferably the silicon material is powdered silicon. The HF is suitably provided at a concentration of 0.01 to 5M, preferably 0.1 to 4M, most preferably 0.25 to 5M, especially 0.25 to 4M, more especially 2 to 4M and particularly 2 to 3M. The $Ag^+$ ions are suitably provided at a concentration of 0.002 to 0.2M, preferably 0.01 to 0.15M.

The process of the present invention will be described herein after with reference to solutions containing silver ions as the nucleating species. It should be appreciated, therefore, that where reference is made to solutions containing silver ions, this should be understood to extend to treating solutions containing ions such as gold, platinum, copper, lead, zinc, cobalt, cadmium, chromium, nickel and tin and mixtures thereof.

As indicated above, the process of the first aspect of the invention comprises a nucleation step in which a dendritic silver mat is deposited on the surface of the silicon substrate and an etching step in which the silicon material underlying the nucleated material of the silver mat is removed to give a silicon based substrate having silicon containing pillars or fibres extending there from.

The silver film or mat formed as a result of the nucleation step comprises an interconnected network of nucleated regions of silver atoms bound to the silicon surface, which nucleated regions are interconnected by dendritic branches formed there between as a result of the dendritic growth of silver atoms extending from and between the originally nucleated regions of silver atoms on the surface of the silicon. The resulting silicon surface comprises regions of exposed silicon separated by regions defining a dendritic silver mat. At the start of the process, nucleation and etching will generally occur simultaneously in the solution. An oxidant may be present at this stage. However, the nucleation step will dominate until substantially all the silver ions are consumed. Once the silver ions have been substantially consumed, the etching step dominates.

For the avoidance of doubt, it should be understood that, in the context of the present invention, the period or phase during the process of the first aspect of the invention over which the nucleation step dominates is known as the nucleation step. During this phase the concentration of silver ions remains above a minimum value. The period or phase over which the etching step dominates is known as the etching step.

By the term silicon nanowires it should be understood to mean elongate structures selected from but not limited to the group comprising fibres, tubes, ribbons and flakes. The term "fibre" should be understood to include pillars, threads and wires and these terms may be used interchangeably herein.

It will be appreciated from the foregoing that the nucleated silver mat will typically catalyse the oxidation and etching of the silicon substrate material underneath the regions of nucleated silver thereby supporting the continued propagation of silicon nanowires until the HF concentration is insufficient to support further etching.

It should be appreciated that where the treating solution comprises metal ions or a mixture of metal ions, the resulting film may be a non-dendritic porous film in which regions of nucleated metal are separated by areas of the exposed silicon surface on which they are deposited. Where a treating solution comprising a mixture of metal ions is used, it is preferred that the treating solution contain a smaller concentration of the metal ion having a more positive redox (or electrochemical potential) and a larger concentration of a metal ion having a less positive redox potential. The metal ion having a more positive redox potential will tend to nucleate on the silicon substrate surface in preference to the metal ion having a less positive redox potential. The concentration of the metal ion having a more positive redox potential is preferably sufficient to provide areas of nucleation over the surface of the silicon but is insufficient to support the formation of a continuous coat or layer. The metal having the less positive redox potential will suitably nucleate preferentially at the nucleation sites provided by the reduction at the silicon surface of ions having a more positive redox potential; this ion will preferably be present in a concentration sufficient to support the formation of a porous layer or mat, which extends from these nucleated areas over the surface of the silicon substrate.

Where a mixture of ions are used in the nucleation step, these can be provided as a mixture in a single solution so that the nucleation can be carried out in a single step or as separate solutions to allow the nucleation step to be carried out in a sequential manner.

As indicated above, a solution comprising 0.01 to 5M HF and 0.001 to 0.7M of an oxidant selected from the group comprising $O_2$, $O_3$, $H_2O_2$, the acid, ammonium or alkali metal salt of $NO_3^-$, $S_2O_8^{2-}$, $NO_2^-$, $B_4O_7^{2-}$ and $ClO_4^-$ or a mixture thereof. Preferred oxidants include the acid, ammonium or alkali metal salts of $NO_3^-$ ions, $O_2$, $O_3$ and $H_2O_2$ or mixtures thereof can be used for the etching step. The use of the acid, ammonium or alkali metal salts of $NO_3^-$ ions as an oxidant is particularly preferred. The concentration at which the oxidant is used in solution will depend upon the nature of the oxidant itself; a stronger oxidant (characterised by a more positive reduction potential) will be used at a lower concentration range than a weaker oxidant. Suitably the etching solution comprises 0.001 to 0.7M of an oxidant or mixture of oxidants referred to above, preferably 0.003 to 0.7M, more preferably 0.02 to 0.7M, most preferably 0.04 to 0.5M and especially 0.04 to 0.07M. Preferably, the etching solution comprises HF at a concentration of 0.1 to 5M, preferably 0.1 to 4M, more preferably 0.25 to 5M, most preferably 0.25 to 4M, especially 2 to 4M and more especially 3 to 4M.

As indicated above, the rate at which the silicon material is etched will be affected by one or more parameters selected from the concentration of HF, the concentration of oxidant, the silicon loading and the surface area of the silicon material. It will therefore be appreciated that for a fixed silicon loading and surface area the etching rate can be controlled by maintaining the concentration of one or both of HF or oxidant in the etching solution over the etching period. Preferably the HF and/or oxidant concentration is maintained through the addition of HF and/or an oxidant species over the course of the etching step. Since the handling of HF is potentially hazardous, the etching rate is preferably controlled by maintaining the concentration of the oxidant over the etching period. The etching rate is most preferably maintained through the addition of an oxidant species to the etching solution over the course of the etching step; this can be accomplished through continuous or sequential addition of oxidant. In a preferred embodiment of the first aspect of the invention, the rate of etching can be controlled through the addition of an oxidant selected from the group comprising $NO_3^-$ ions, $O_2$, $O_3$ and $H_2O_2$ or mixtures thereof. The use of $NO_3^-$ ions as an oxidant is especially preferred.

A second preferred embodiment of the first aspect of the invention provides a process for treating silicon, the process comprising the steps of exposing silicon-containing material to a solution comprising:
0.01 to 5M HF
0.002 to 0.2M of a metal ion capable of nucleating on and forming a porous layer comprising regions of elemental metal on the silicon surface;
0.001 to 0.7M of an oxidant selected from the group $O_2$, $O_3$, $H_2O_2$, the acid, ammonium or alkali metal salts of $NO_3^-$, $S_2O_8^{2-}$, $NO_2^-$, $B_4O_7^{2-}$ and $ClO_4^-$ or a mixture thereof;
and adding further oxidant species to the solution to maintain the concentration of oxidant within the above range. The treated silicon may be separated from the solution. The silicon material is preferably powdered silicon.

The process of the first aspect of the invention can be applied to silicon-containing wafers and silicon-containing chips, wafer fragments, granules and particles. The terms "silicon-containing chips, wafer fragments, granules and particles" will hereafter collectively be referred to as silicon-containing powder. In a preferred embodiment of the first aspect of the invention the silicon-containing material is a silicon-containing powder.

Where the process of the present invention refers to an etching solution, this will be described herein after with reference to etching solutions containing $NO_3^-$ ions as the oxidant. It should be appreciated, therefore, that where reference is made to solutions containing $NO_3^-$ ions, this should be understood to extend to solutions containing $O_2$, $O_3$, the acid, ammonium or alkali metal salts of $NO_3^-$, $S_2O_8^{2-}$, $NO_2^-$, $B_4O_7^{2-}$, $ClO_4^-$ and $H_2O_2$ or mixtures thereof.

A third preferred embodiment of the first aspect of the invention provides a process for treating silicon, the process comprising the steps of exposing silicon-containing material to a solution comprising:
0.01 to 5M HF
0.002 to 0.2M of Ag+;
0.001 to 0.7M of $NO_3^-$ ions;
and adding further $NO_3^-$ ions to the solution to maintain the concentration of $NO_3^-$ within the above range, wherein the NO3- are provided in the form of the an acid, ammonium or alkali metal nitrate; and separating the treated silicon from the solution. Preferably the silicon-containing material is a silicon-containing powder.

It will be appreciated from the foregoing that the nucleation step can either occur substantially simultaneously with the etching step or can be partially separated there from by controlling the concentration of HF, metal ions and oxidant in the treating solution.

The process according to the first aspect of the invention is simple to operate on a commercial scale. In a fourth preferred embodiment of the first aspect of the invention, the nucleation step can be substantially separated from the etching step. This can be achieved by carrying out the etching and nucleation step in separate baths or by adding HF and/or an oxidant to the reaction chamber at the end of the nucleation step to bring the concentration of species in the treatment solution within the range specified for the nucleation and etching steps respectively. The concentration of species in the treating solution that are used for the nucleation step may be different to the concentration of species used for the etching step. Preferably the concentration of HF and/or oxidant used for the nucleation step is lower (eg 0.5M) than the concentration of HF and/or oxidant used in the etching step (eg 3 to 4M). Alternatively, in a fifth preferred embodiment of the first aspect of the invention, nucleation and etching can be carried out substantially simultaneously. This can be achieved by contacting the silicon particles or granules with a solution comprising 0.01 to 5M HF, 0.002 to 0.2M of metal ions capable of nucleating on and forming a porous layer on the silicon surface, preferably 0.01 to 0.15M and 0.001 to 0.7M, preferably 0.01 to 0.15M of an oxidant in the same bath. Preferably the solution comprises 0.1 to 4M, preferably 0.25 to 4M, more preferably 2 to 4M HF and especially 3 to 4M HF. Preferably the etching solution comprises 0.003 to 0.7M (for example 0.02 to 0.7M or 0.04 to 0.5M) of an oxidant or mixture of oxidants referred to above, more preferably 0.01 to 0.1M and especially 0.04 to 0.05M. It is further preferred that the HF and the oxidant are present in a concentration ratio in the range 100:1 to 300:1, preferably 175:1 to 275:1 and especially 250:1. The metal ion is preferably a silver ion. The oxidant is preferably a nitrate ion. The treating solution suitably comprises an aqueous solution of HF and a source of nitrate ions derived from one or more of an alkali metal nitrate, ammonium nitrate and nitric acid in the concentration ranges specified above.

As indicated above, it has been found that advantageous results have been obtained by performing the nucleation step at a lower HF concentration and by performing the etching step at a higher HF concentration. Without wishing to be constrained by theory, it is believed that by carrying out the nucleation step in a solution in which the concentration of HF is within the ranges specified herein and is less than the concentration of HF in the solution used for etching, the nucleation step is more controlled, which results in improved pillar formation. The nucleation step is suitably carried out using a treating solution having an HF concentration of less than 5M. Suitably the treating solution used for nucleation has an HF concentration in the range 0.01 to 5M, preferably 0.25 to 5M, more preferably 0.24 to 5M, most preferably 1 to 5M, especially 2 to 4M and more especially 2 to 3M. Alternatively the treatment solution used for nucleation has an HF concentration in the range 0.01 to 4M, preferably 0.1 to 2M, more preferably 0.1 to 1M and especially 0.5M. Etching is suitably carried out using a treating solution having an HF concentration of greater than 0.1M, with the proviso that the HF concentration of the etching solution is greater than that of the nucleation solution, for example at least 0.5-2M higher. The treating solution used for etching typically has an HF concentration in the range 0.1 to 5M, preferably 0.1 to 4M, more preferably 0.25M to 5M, most preferably 0.25 to 4M, especially 2 to 4M and more especially 3 to 4M. Alternatively a treatment solution used for etching may suitably have an HF concentration in the range 0.25 to 10M, preferably 1 to 8M, more preferably 2 to 7.5M, most preferably 4 to 7.5M and especially 6 to 7.5M.

It will be appreciated that the process described in accordance with the fourth embodiment of the first aspect of the invention can be achieved though a number of different approaches. A first preferred approach provides a process for treating silicon, the process comprising a nucleating step and an etching step, wherein the nucleating step requires exposing silicon to a solution comprising 0.01 to 5M HF and 0.002 to 0.2M of a solution of a metal ion as defined herein above and the etching step requires exposing the nucleated silicon to a solution comprising 0.25 to 10M HF and 0.003 to 0.7M of an oxidant or mixture of oxidants referred to above with the proviso that the concentration of HF used in the etching step is greater than the concentration of HF used in the nucleation step, for example at least 0.5-2 M higher. Suitably the treating solution used for nucleation has an HF concentration in the range 0.01 to 5M, preferably 0.1 to 4M, more preferably 0.25 to 5M, most preferably 1 to 5M, especially 1 to 4M and more especially 2 to 4M, for example 2 to 3M. Alternatively the treatment solution used for nucleation has an HF concentration in the range 0.01 to 5M, preferably 0.1 to 4M, more preferably 0.1 to 2M, most preferably 0.1 to 1M and especially 0.5M. The treating solution used for etching typically has an HF concentration in the range 0.1 to 5M, preferably 0.1 to 4M, more preferably 0.25M to 4M, most preferably 2 to 4M and especially 3 to 4M. Alternatively a treatment solution used for etching may suitably have an HF concentration in the range 0.25 to 10M, preferably 1 to 8M, more preferably 2 to 7.5M, most preferably 4 to 7.5M and especially 6 to 7.5M.

Although in accordance with the fourth embodiment of the first aspect of the invention, it is preferred to carry out the nucleation step using a solution having an HF concentration of less than 4M or 5M, nucleation solutions having HF concentrations of greater than 4M or 5M can be used for the nucleation step, with the proviso that the concentration of HF in the etching solution is greater than the concentration of HF used in the nucleation solution. It will thus be appreciated that it will be possible to carry out nucleation at an HF concentration of up to 7M, preferably up to 6M and especially up to 5M. Preferably, nucleation will be carried out using a treatment solution having an HF concentration in the range 0.01 to 7M, preferably 0.01 to 6M and especially 0.01 to 5M.

It is preferred that, in accordance with the fourth embodiment of the first aspect of the invention, where the nucleation step is carried out substantially separately from the etching step, the silicon is treated in a first step with a solution comprising 0.002 to 0.2M, preferably 0.01 to 0.15M of metal ions and HF having a concentration of at least 0.01M, preferably at least 0.25M and especially 0.5M to form a silver coated silicon product and, in a second step, the silver coated silicon product is treated with an etching solution comprising 0.1 to 10M HF and 0.001 to 0.7M, preferably 0.02 to 0.7M of an oxidant with the proviso that the concentration of HF in the nucleating solution is smaller than the concentration of HF in the etching solution, for example at least 0.5 to 2M smaller. The HF concentration used for etching is typically greater than the HF concentration used for nucleation by between 2 and 6 pH points. The concentration of HF and/or the oxidant can be maintained during the etching process by adding HF and/or oxidant to the etching solution. Suitably, the concentration of HF and/or oxidant can be continuously monitored and further HF and/or oxidant may be added to the etching solution, either in one or more discrete steps or continuously over the duration of the etching period to maintain the concentration of HF and/or oxidant within the concentration ranges specified herein. In a preferred embodiment of the first aspect of the invention, the concentration of oxidant is maintained over the duration of the etching step and the concentration of HF is allowed to drop.

Where, according to the fourth aspect of the invention, nucleation is carried out separately, the concentration of the silver ions is suitably monitored during the nucleation phase until their concentration falls below a minimum value; a silver mat collects on the surface of the silicon and the silver-coated silicon product forms a deposit in the solution during this phase. The silver/silicon deposit can be separated from the solution either by filtration or decantation, where liquid is drained away from the solid. As indicated above, the nucleating solution contains, in addition to silver ions (as nitrate salt), HF at a concentration range of 0.01 to 5M. Preferably the HF is provided in a concentration range of 0.01 to 4M, more preferably 0.1 to 2M, most preferably 0.1 to 1M and especially 0.5M.

The resulting silver/silicon solid can then be transferred to an etching solution, which has an HF and nitrate ion concentration falling within the ranges specified herein with the proviso that the HF concentration of a solution used for the nucleation step is less than the HF concentration of a solution used for the etching step, and gently stirred. Alternatively, the etching solution can be added to the solid silver/silicon deposit formed in the nucleation step. During the etching step, the HF and $NO_3^-$ concentrations are carefully monitored and the $NO_3^-$ concentration is maintained within the concentration ranges specified herein. The end of the etching step is considered to be reached at a point in time when the HF concentration drops below a minimum value, typically 2-3M or lower. Alternatively, the etching step can be carried out over a fixed period of time by maintaining both the HF and $NO_3^-$ concentrations within the ranges specified. In the former case it will be necessary to add extra $NO_3^-$ ions to maintain the concentration of these ions within the range given. In the latter case it may be necessary to add extra HF as well as extra $NO_3^-$ ions to maintain the levels of both HF and $NO_3^-$ within the ranges given.

An etching solution typically comprises HF at a concentration in the range 0.1 to 5M, preferably 0.1 to 4M, more preferably 0.25 to 4M, most preferably 2 to 4M and especially 3 to 4M.

Alternatively and as will be appreciated from the foregoing, because it is possible to carry out the nucleation step at an HF concentration of greater than 4M, preferably at a concentration in the range 4 to 6M and especially 4.5 to 5.5M, it will be necessary to use solutions having a concentration of HF of greater than 4M, preferably greater than 5M and especially greater than 6M for etching. Preferably a solution used for etching will have an HF concentration of 4 to 10M, preferably 5 to 9M, most preferably 6 to 8M and especially 7.5M.

Typically, in accordance with a fourth embodiment of the first aspect of the invention, the nucleation step is carried out using a treatment solution having an HF concentration of less than 5M and the etching step is carried out using a treatment solution having an HF concentration of greater than 5M. It is especially preferred to carry out the nucleation step using a treatment solution having an HF concentration of 2M and to carry out the etching step using a treatment solution having an HF concentration in the range 3 to 10M, preferably 7.5M. A preferred process according to the fourth embodiment of the first aspect of the invention provides a nucleating solution having an HF concentration of 0.5M and an etching solution having an HF concentration of between 3 and 4M.

In a further preferred approach according to the fourth embodiment of the first aspect of the invention, the nucleating solution has an HF concentration of 2M and the etching solution has an HF concentration of 7.5M.

Where the nucleation step employs a mixture of nucleating metal species, the nucleating species may be provided in the form of separate nucleating solutions. Separate reaction chambers (baths) will typically be provided for each nucleating solution.

It will be appreciated that where nucleation and etching are carried out separately, it may be possible to better control and therefore optimise the reaction parameters for each of the nucleation and etching steps by controlling the concentration and composition of each of the nucleating and etching solutions within concentration ranges falling within those concentration ranges defined herein above. This can be achieved through the use of separate reaction chambers or baths or through the use of a reaction chamber having reagent inlet means via which nucleation and/or etching solutions can be introduced and outlet means via which the spent nucleation and/or etching solutions can be removed as required. The use of separate reaction chambers is preferred since this means that it is possible for the process according to the first aspect of the invention to be carried out in batches. A batch method can be used to good effect when processing larger quantities of silicon, since the silicon can be divided up into a number of portions so that etching of a nucleated portion of silicon can be carried out at the same time as the etching of a silicon portion that has not undergone nucleation. It has been found that by using the process according to the first aspect of the invention in which the HF concentration in the solution used for nucleation is smaller than the HF concentration in the solution used for etching, the products formed are characterised by an even distribution of pillars over the substrate surface and by pillars having a narrow range of diameters and lengths.

The separation of the nucleation and the etching steps (either through the use of separate baths or through the provision of a reaction vessel which allows easy introduction and removal of reaction solutions) means that it is possible to conduct the nucleation step on a different quantity of silicon material to that used for etching, for example. For example, it may be possible to divide a silicon sample up into a number of smaller portions for nucleation and to recombine all or a number of the nucleated portions for etching. The separation of the nucleation and the etching step means that it is possible to process the silicon in batches and to optimise the conditions for both the nucleation and the etching steps.

A particularly preferred embodiment of the fourth embodiment of the first aspect of the invention provides a process for processing silicon, which process comprises separately treating, either simultaneously or sequentially, one or more portions of silicon with a nucleating solution as defined herein above; combining the nucleated silicon portions and treating the combined silicon portions with an etching solution as defined herein above.

As indicted above, in a fifth embodiment of the first aspect of the invention, the nucleation and etching steps can also be carried out together in a single reaction chamber. This can be achieved by preparing a treatment solution according to the first aspect of the invention or according to any of its preferred embodiments and placing this treatment solution in a container or reaction bath together with the silicon to be etched, monitoring the concentration of HF and $NO_3^-$ over the course of the treatment process, maintaining the concentration of $NO_3^-$ within the ranges specified herein and terminating the treatment either when the concentration of HF falls below a predetermined value or by removing etched silicon from an etching solution in which both the concentration of HF and $NO_3^-$ ions has been maintained within the ranges specified herein after a fixed period of time. Reaction times have been found to be dependent on parameters such as the quantity and size of the silicon particles or granules, process conditions such as temperature, pressure and reagent concentration. Reaction times of between 30 and 600 minutes, preferably between 30 and 400 minutes and especially between 60 and 300 minutes are typical, although reaction times falling outside these ranges may be employed. Where the nucleation and etching steps are carried out simultaneously, the concentration of $NO_3^-$ is maintained within the ranges specified herein above by adding $NO_3^-$ to the treating solution. The concentration of HF is suitably in the range 0.01 to 5M, preferably 0.1 to 4M, more preferably 0.25 to 4M, most preferably 2 to 4M and especially 3 to 4M. The concentration of silver ions is typically in the range 0.002 to 0.2M, for example 0.01 to 0.15M.

Secondly, a single container or reaction bath may be provided with a fluid inlet and a fluid outlet via which nucleation and etching solutions may be introduced into and removed there from. The silicon to be etched may be introduced into the container or reaction bath before or after the introduction of reagents. Preferably the nucleating solution is introduced into the reaction chamber before the silicon to be etched. The treatment of the silicon can be carried out by mixing the silicon with the nucleating solution in the chamber, monitoring the concentration of $Ag^+$ in solution and then adding the etching solution to this mixture when the concentration of silver ions has dropped below a minimum concentration. Alternatively the spent nucleation solution can be removed from the container or reaction bath when the concentration of silver ions had dropped below a minimum value; the etching solution can then be introduced into the bath. During etching the HF and $NO_3^-$ concentrations are carefully monitored and the $NO_3^-$ concentration is maintained within the concentration ranges specified herein; this is best achieved through addition of $NO_3^-$ ions. The end of the etching step is considered to be reached when the concentration of HF falls below a minimum value. As indicated above, where the etching step is separated from the nucleation step the etching solution preferably contains HF at a concentration in the range 0.1 to 5M, preferably 0.1 to 4M, more preferably 0.25 to 5M, most preferably 2 to 4M and especially 3 to 4M. An etching solution containing HF at a concentration of 0.25 to 10M, preferably 2 to 8M, more preferably 3 to 7.5M, most preferably 4 to 7.5M and especially 6 to 7.5M can also be used. An intermediate washing step may be carried out between the nucleation and etching stages. In a preferred embodiment, the nucleation solution is removed from the chamber at the end of the nucleation phase and prior to the introduction of the etching solution.

As indicated above, etching can be carried out in one or more steps. It is preferable to control one or both of the concentration of HF and/or $NO_3^-$ during this step. $NO_3^-$ ions will be added to an etching solution comprising HF and $NO_3^-$ ions to maintain the $NO_3^-$ concentration over the etching period. If desired, additional HF can be added to the etching solution, either in a single step, in two or more steps or continuously over the etching period to maintain the concentration of HF within the ranges specified herein.

An advantage of the process of the present invention lies in the fact that it only requires the use of a small number of ingredients whose concentration can be easily controlled. In particular it does not require the use of oxidising metal ions in addition to the silver ions to secure efficient etching of the silicon surface. This greatly improves the logistics of processing the spent etching solution and means that the process of the present invention is much simpler, cheaper and safer to operate than previous processes.

The process of the present invention can be used to fabricate silicon pillars or fibres from lower purity silicon materials such as silicon powders derived, for example, from metallurgical grade silicon as well as powders derived from higher purity silicon wafers or chips. The silicon materials may include coated and uncoated structures. Coated structures include particles or granules having a silicon coating applied to a non-silicon substrate as well as particles or granules having a silicon coating having a first composition applied to a silicon substrate having a second composition that is different to that of the first composition. Where the silicon materials include a silicon coating applied to a non-silicon substrate, the substrate may be an electroactive material, a conductive but non-electroactive material or an insulator. Examples of electroactive materials include graphite, hard carbon, tin, aluminium, gallium, germanium, an electroactive ceramic material, a transition metal oxide, a chalconide or a structure formed from one or more of these electroactive materials. Examples of non-electroactive conducting materials include conductive carbons such as carbon black or conductive polymer materials. For both coated and uncoated starting materials the silicon can include within its structure a dopant such as a p-type dopant or an n-type dopant. The inclusion of dopants typically improves the conductivity of the materials. Examples of p-type dopants for silicon include B, Al, In, Mg, Zn, Cd and Hg. Examples of n-type dopants for silicon include P, As, Sb and C.

Using the process according to the first aspect of the invention typically gives a product in the form of silicon-comprising "pillared particles", i.e. particles having pillars formed on their surface. Alternatively, where the etched pillars are totally or partially removed from the granular silicon during the etching step, the product of the process can include fibres instead of or in addition to pillared particles, for example. The products of the process of the present invention can be used in the manufacture of anode material for lithium ion cells; these materials have been found to be excellent for this application.

SPECIFIC DESCRIPTION OF PREFERRED EMBODIMENTS

Figure 1:
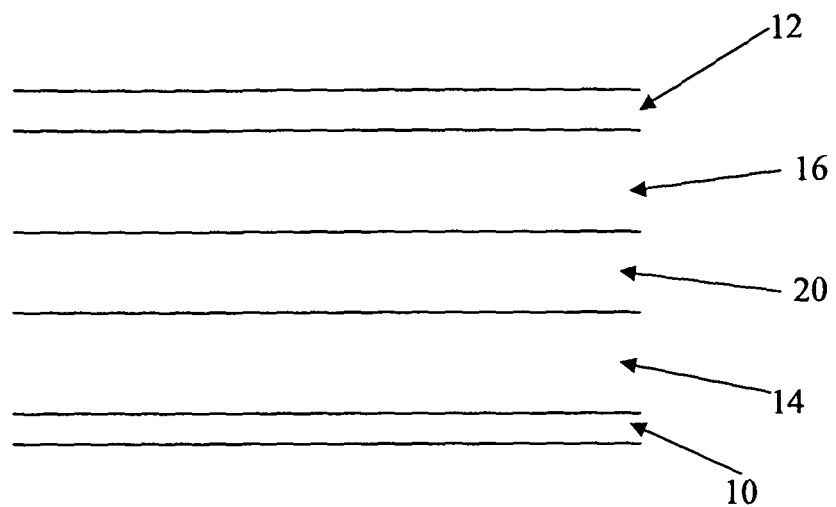
FIG. 1 is a schematic diagram showing the components of a battery cell.
Figure 2:
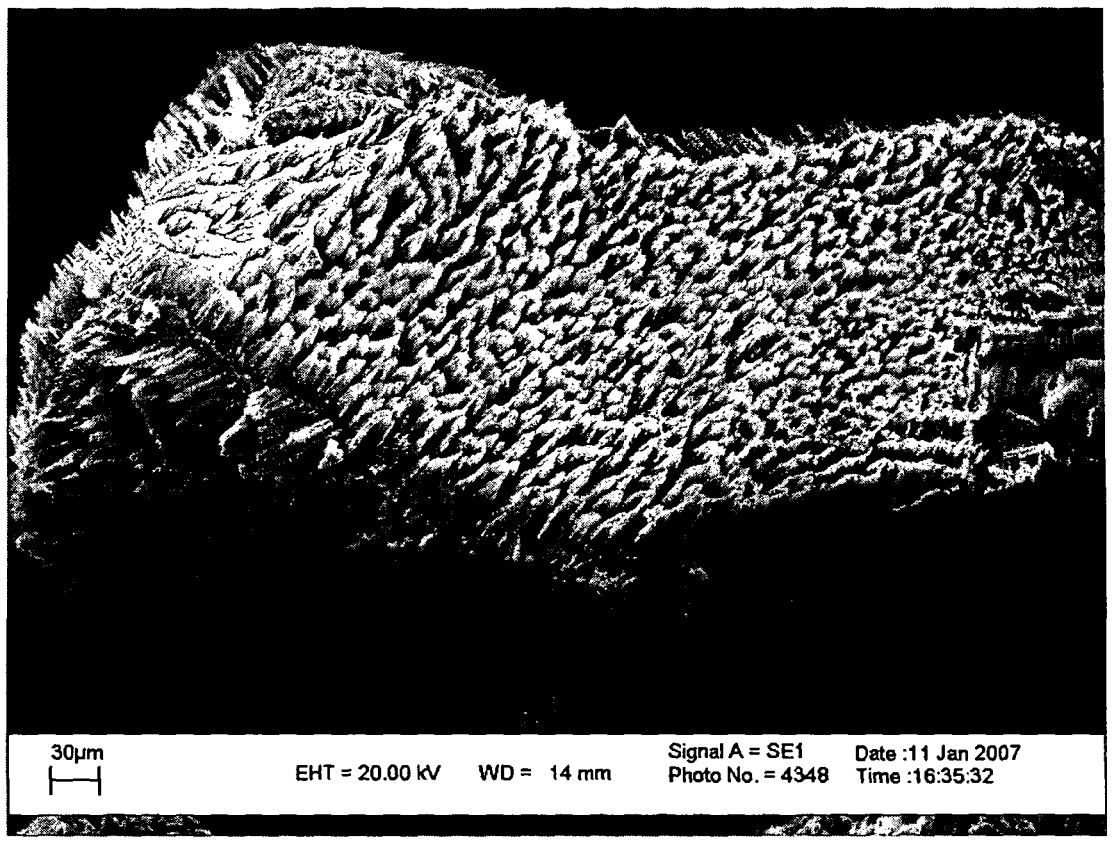
FIG. 2 is an electron micrograph of a pillared particle produced according to the method described in WO 2009/010758.
Figure 3:
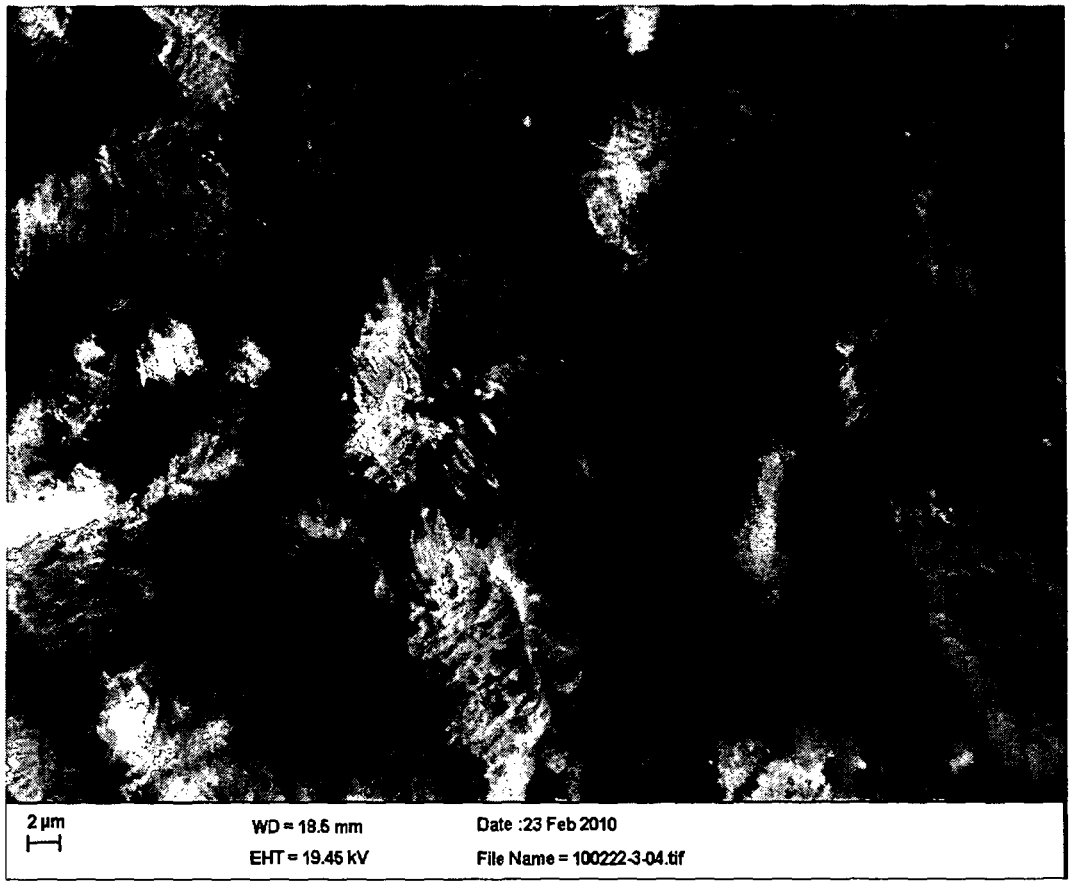
FIG. 3 is an electron micrograph of a pillared particle produced according to the method of Example 1 of the present invention.

In the following description, the invention will be described by reference to etching of granular silicon to form etched silicon particles using silver ions for the nucleation step. It will be understood from the foregoing that the invention is not limited to the use of silver ions as the nucleating species and extends to other metal ions that are able to form a porous layer on the silicon surface upon nucleation.

It should be understood from the foregoing that the invention is not limited to the use of $NO_3^-$ as an oxidant and extends to other oxidants selected from the group comprising $H_2O_2$, $O_2$, $O_3$, acid, ammonium and alkali metal salts of $ClO_4^-$, $KMnO_4$, $Cr_2O_7^{2-}$, $S_2O_8^{2-}$, $NO_2^-$ and $B_3O_7^{2-}$, for example.

It is generally believed that the treatment process according to the first aspect of the invention involves two processes: nucleation and etching. At the start of the process, the nucleation step dominates until substantially all the nucleating ions in the solution have been consumed. At this point, the etching step becomes more dominant and proceeds until substantially all the fluoride ions in solution have been consumed.

During the nucleation stage, islands of silver are deposited electrolessly on the silicon granules according to the reaction:

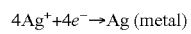

$$4Ag^+ + 4e^- \rightarrow Ag \text{ (metal)}$$

Nucleation will generally take up to about 1 minute. Longer nucleation times (up to 40 minutes) have been used. The nucleating reaction is generally carried out at a temperature of greater than 0° C. Preferably the nucleating temperature does not exceed 80° C. Nucleation is suitably carried out at a temperature of between 15° C. and 70° C., preferably 25° C. to 50° C. and especially 25° C. to 40° C. Nucleation may be carried out in the light or in the dark.

At the beginning of the treatment process according to the first aspect of the invention, etching occurs preferentially along certain crystal planes and the silicon is etched into columns. The silicon is etched according to the following equation:

$$Si + 6F^- \rightarrow SiF_6^{2-} + 4e^- \qquad \text{Half-reaction (1)}$$

The electrons generated by half reaction (1) are conducted through the silicon to the deposited (nucleated) silver where the counter reaction occurs in which silver ions in the solution are reduced to elemental silver:

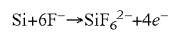

$$4Ag^+ + 4e^- \rightarrow 4Ag \text{ (metal)} \qquad \text{Half-reaction (2)}$$

The elemental silver deposited according to half-reaction (2) forms dendrites, which extend from and between the initially deposited islands of silver. The dendrites will interlock with dendrites on the same deposited particle (island) and on other deposited particles (islands) and so form a mat. The interconnection of the dendrites speeds up the electrolytic process because there are more sites where the reduction half reaction (2) can take place and the charge can be delocalised. Without wishing to be constrained by theory, it is believed that the nucleated silver mat catalyses half-reaction (1) causing the silicon material under the nucleated silver islands to be etched away in preference to silicon material not so covered. This results in the formation of silicon pillars on the silicon substrate. Some gas will be evolved in the process and this can cause the mat to float.

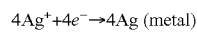

Although not essential, the reaction mixture is preferably subjected to gentle stirring. The mixture can be stirred using a magnetic stirrer or by gently bubbling gas through the mixture. The rate of stirring must be sufficient to facilitate the formation of and maintain the integrity of the dendritic silver mat during the nucleation step and etching step. The rate of stirring will be apparent to a skilled person and will depend in part on factors such as the silicon loading and the silver concentration.

The granular or particulate silicon starting material may comprise undoped silicon, doped silicon of either the p- or n-type or a mixture, such as a silicon-aluminium doped silicon. It is preferred that the silicon includes within its structure a dopant such as a p-type dopant or an n-type dopant. The inclusion of dopants typically improves the conductivity of the materials. Examples of p-type dopants for silicon include B, Al, In, Mg, Zn, Cd and Hg. Examples of n-type dopants for silicon include P, As, Sb and C. Dopants such as Germanium and Silver can also be used. We have found that p-doped silicon having $10^{19}$ to $10^{20}$ carriers/cc works well. Such material may be obtained by grinding doped silicon, e.g. silicon from the IC industry, and then sieving the ground material to obtain granules with the desired size.

Alternatively, the granules or particles may be of relatively low purity metallurgical grade silicon, typically with a silicon purity of 99.4-99.9%, which is available commercially; metallurgical grade silicon is particularly suitable because of the relatively high density of defects (compared to silicon wafers used in the semiconductor industry) and the presence of dopant impurities such as Al. This leads to a low resistance and hence high conductivity, which is advantageous when the pillar particles or fibres are used as anode material in rechargeable cells. Such silicon may be ground and graded as discussed above. An example of such silicon is "Silgrain™" from Elkem of Norway, which can be ground and sieved (if necessary) to produce particles. Granules having a mean particle diameter in the range 1 μm to 1.5 mm, preferably 1 μm to 1 mm, more preferably 10 μm to 800 μm may be used. Granules having a diameter in the range 1 to 100 μm, preferably 3 to 100 μm, more preferably 10 to 50 μm, most preferably 20 to 40 μm and especially 15 to 25 μm are generally (but not exclusively) used for making pillared particles. Granules having a mean diameter in the range 100 to 800 μm are generally (but not exclusively) used for making fibres. The granules may be regular or irregular in cross section.

When making silicon fibres, the granules remaining after the fibres have been removed can be recycled.

The particles or granules used as starting materials may have a silicon-purity of 90.00% or over by mass, preferably 98.00% or over. Silicon granules or particles having a silicon-purity in the range 99.0% to 99.99% are especially preferred. The silicon can be doped with any material for example, germanium, phosphorous, aluminium, silver, boron and/or zinc The granules used for etching may be crystalline for example mono- or poly-crystalline with a crystallite size equal to or greater than the required pillar height. The polycrystalline particle may comprise any number of crystals for example two or more.

The etching step may be carried out at a temperature of 0° C. to 70° C., suitably between 10 and 50° C., preferably between 15 and 40° C. and especially at room temperature since only very expensive containers will be able to withstand the highly corrosive HF at temperatures towards the top end of the above range. For that reason the temperature will generally not exceed 50° C. If necessary, the reaction mixture may have to be cooled in the course of the process since it is exothermic.

The reaction mixture may also be light irradiated during the nucleation and etching step. The intensity and wavelength of the light used will depend on the nature of the silicon being etched. The reaction material will suitably be irradiated with a light source having a wavelength in the region of the bandgap of the silicon material being etched. The use of visible light is preferred. Reaction containers may be fabricated from or may include light transmitting materials such as polyethylene. Other suitable materials that can be used in the fabrication of reaction chambers include fluorocarbon plastics, polypropylene, lead and platinum. The reaction chambers may be lined with HF-resistant materials, such as HF-resistant rubbers.

The process should be terminated at a time when the silicon has been etched sufficiently to provide well-defined pillars of at least 100 nm, preferably at least 500 nm. The pillar height is preferably no more than 1 mm, more preferably no more than 500 μm. Suitable ranges for the pillar height are 1 to 500 μm, preferably 1 to 300 μm, eg 1 to 100 μm and more preferably 1 to 40 μm. The pillar height for pillared particles will generally be 1 to 5 μm, preferably 2 to 4 μm and especially 3 to 4 μm and when making isolated fibres will be larger, e.g. 10 to 100 μm. The optimum duration of the process will depend on the concentration of the materials in the solution, the conductivity of the silicon, the temperature and the amount of etching solution used as compared to the amount of granular silicon being etched. Process times of between 30 and 600 minutes, preferably between 30 and 400 minutes and especially between 60 and 300 minutes have been found to produce silicon fibres of an acceptable quality. Since the reaction time depends upon factors such as the quantity and size of the silicon particles or granules used, the reaction temperature and the concentration of reagents in the treating solution, it will be appreciated that it will be necessary on occasion to use process times outside those detailed herein.

Depending upon the reaction conditions employed, the pillars may taper away from their bases, i.e. where they are attached to the underlying silicon, and the diameter of the pillars at their bases will generally be of the order of 0.02 to 0.70 μm, e.g. 0.1 to 0.5 μm, for example 0.1 to 0.25 μm, preferably in the range 0.08 to 0.70 μm. The pillars will thus generally have an aspect ratio in the range 5:1 to 100:1, preferably in the range 10:1 to 100:1. The pillars may be substantially circular in cross-section but they need not be.

Where the granules or particles used as starting material have a principal diameter in the range 800 μm to 1.5 mm, the etched particles produced by the process according to the first aspect of the invention typically have a principal diameter in the range 800 μm to 1.5 mm, a core diameter in the range 500 to 800 μm and pillar heights in the range 300 to 500 μm. Where the granules or particles used as starting material have a principal diameter in the range 300 to 800 μm, the etched particles typically have a principle diameter in the range 300 to 800 μm, a core diameter in the range 100 to 700 μm and pillar heights in the range 50 to 350 μm. Where the granules or particles used as starting material have a principal diameter in the range 100 to 300 μm, the etched particles typically have a principal diameter in the range 100 to 300 μm, a core diameter in the range 20 to 100 μm and pillar heights in the range 40 to 100 μm. Where the granules or particles used as starting material have a principal diameter in the range 10 to 100 μm, the etched particles typically have a principle diameter in the range 10 to 100 μm, a core diameter in the range 3 to 30 μm and pillar heights in the range 2 to 30 μm. Pillared particles formed from granules or particles having a principle diameter of less than 10 μm tend to form particles having a similar overall diameter, core diameters of between one quarter and one half the diameter of that of the original particle and pillar heights of between one tenth and one half of the diameter of the original particle.

A pillar fractional surface density may be used to define the density of the pillars on a surface or surfaces of the particle. Herein, this is defined as F=P/[R+P] wherein: F is the pillar surface density; P is the total surface area of the particle on the surface or surfaces occupied by pillars; and R is the total surface area of the same surface or surfaces that is unoccupied by pillars. The term surface can be considered to include planes, crystal faces and sides.

The larger the pillar surface density, the larger the lithium capacity per unit area of a silicon particle electrode and the larger the amount of harvestable pillars available to create fibres. A fractional pillar surface density, F, of 5-80%, more typically 20% to 50% is preferred for pillared particles. For making fibres, silicon substrates having a fractional surface density of between 40 and 80%, preferably between 40 and 60% provide a good yield of silicon fibres. Not all surfaces of a pillared particle may have pillars. Where there are surfaces without pillars, the above values for F are calculated for only the surfaces with pillars. For example, if only one surface of a wafer is etched to form pillars, only the surface area of that surface is used in the calculation of F.

The rate at which the etching of the silicon materials takes place during the etching step has been found to be influenced by factors such as the reaction temperature, the concentration of silicon particles or granules (silicon loading), the size and surface area of the particles or granules, the HF concentration, the oxidant concentration and the illumination level. It has been found that a high HF concentration of HF and/oxidant causes the etching reaction to occur too quickly, which leads formation of products in which the silicon pillars have been etched horizontally as well as vertically. If the silicon loading is too high, the silicon pillars formed are of a poor quality. Additionally if the silicon surface area is high a high HF concentration must be avoided to prevent the rate of etching from proceeding too rapidly.

It has been found that for silicon particles or granules having a average principle diameter of the order of 25 μm, pillars and pillared particles of acceptable quality have been obtained by loading silicon at a level of 15 to 40 g/l in a treating solution having an HF concentration of 7.5M. For silicon particles or granules having an average principle diameter of 12 μm, acceptable results have been achieved using a silicon loading in the range 15 to 20 g/l. A silicon loading of 7 to 10 g/l has been found to be acceptable for silicon particles having an average principle diameter of 6 μm.

As will be appreciated from the foregoing, nucleation and dendrite growth require the presence of silver in the solution, but once these stages are completed, etching requires only the presence of an ion in solution that can be reduced. This can be silver (half reaction 2) but equally it need not be and, since silver is expensive, it is preferred to use some other counter reaction. In WO2007/083152 the present applicants have suggested the addition of ferric nitrate to provide ferric ions that can be reduced to ferrous ions in a counter reaction. However, we have found that the addition of ferric ions to the reaction mixture adds to the complexity and cost of the process.

WO2007/083152 also suggests the use of hydrogen ions to provide the counter reaction but the hydrogen and fluoride ions concatenate in solution, reducing the availability of hydrogen ions for this purpose.

We have found that the optimum counter reaction is the reduction of nitrate ions in solution. The reduction of oxygen gas or ozone provides an alternative counter reaction. The nitrate ion is preferred because it is already present in the solution since silver will be added in the form of silver nitrate and also because other anions may precipitate the silver.

Although WO2007/083152 suggests that nitrate ions be added during the etching step, this is in the form of silver nitrate or ferric nitrate. The former is expensive and in the latter, the ferric ions will also be reduced with the disadvantages mentioned above. We therefore add nitrate to the etching solution as an alkali metal nitrate, ammonium nitrate or nitric acid, particularly sodium nitrate or ammonium nitrate because these materials have a high solubility but are also cheaper than ferric nitrate and have inert cations ($Na^+$ and $NH_4^+$) that are not detrimental in the solution.

The etching solution is preferably substantially free of iron ions (ferric or ferrous). By "substantially free" we mean that there is an insufficient concentration to have a material effect on the process and should generally be less than 0.05% by weight and less than 5 mM, e.g. less than 2 mM.

It was a feature of WO2007/083152 that an alcohol should be present in the nucleation stage and should be present in an amount of 1 to 40%. The process of WO2007/083152 was carried out on a chip or wafer and we have found that, in the context of the present process carried out on silicon granules, the presence of alcohol is not necessary and its presence complicates the process since it is another ingredient that must be considered when controlling the concentrations in the solution. Accordingly, the solution used in the present invention is, in accordance with one embodiment of the present invention, substantially free of an alcohol, by which is meant that the amount of any alcohol is less than the concentration that has a material effect on the process and may be less than 0.5% by volume.

If the solution is used for both nucleation and etching, the initial concentration of HF is suitably in the range 0.01 to 5M, preferably 0.25 to 5M, more preferably 0.1-4M, most preferably 1 to 4M, e.g. 2M to 4M and generally about 2M or 3M HF. Further HF can be added to the reaction mixture in order to maintain the HF concentration at a predetermined level referred to above or to increase HF to between 3 and 7.5M, should this HF concentration be required for etching. The maintenance of a fixed HF concentration may be needed in the course of the process if a large amount of material is etched compared to the volume of the solution.

Alternatively, the treatment process according to the first aspect of the invention may be allowed to continue until the concentration of HF is insufficient to support further etching of the silicon substrate. By allowing the HF concentration to drop over the course of the treatment process, handling and disposal of the waste etchant solution is greatly simplified.

In order to deposit the islands of silver and the dendrites, the concentration of $Ag^+$ may be in the range 0.002M to 0.2M, e.g. 0.01M to 0.15M, generally 0.01M to 0.09M, especially 0.07M. The amount of $Ag^+$ ions is preferably insufficient to participate in the etching of all the silicon in the process but rather should be limited to an amount sufficient only to form the islands and dendrites. The concentration of silver ions used will depend in part on the surface area of the silicon particles being etched as well as the silicon loading of the solution. Smaller particles having a larger surface area will, in general, require the use of higher concentrations of silver compared to larger particles having a smaller surface area. The half reaction that counters the etching half reaction is then provided by the reduction of nitrate ions. Silver is preferably not added to the solution after the etching reaction has started.

As indicated, $NO_3^-$ may provide a counter reaction to the etching of the silicon (half reaction (1)) and may be present at a concentration of 0.001 to 0.7M, preferably 0.003M to 0.7M, e.g. 0.01M to 0.5M, e.g. about 0.3M. The silver will generally be added to the etching solution in the form of its nitrate salt since other salts are generally insoluble. This will provide some of the nitrate ions required and any balance may be made up by adding alkali metal nitrate, e.g. sodium or potassium nitrate or ammonium nitrate in the course of the process. The $NO_3^-$ ions may be added in one or more steps; further $NO_3^-$ may be added after 35% to 65% of the overall process time.

Although (as discussed above) other oxidants may be added to the solution, the concentration of the other oxidants used will depend upon their strength. Stronger oxidants (having a more positive reduction potential relative to hydrogen) will tend to be employed at a lower concentration.

$SiF_6^{2-}$ will be generated in the solution once etching has started.

It will be appreciated that the pH of the solution may change during the course of the treatment process. This may be because of the generation of additional hydrogen ($H^+$) ions through the use etchant solutions having the concentrations of hydrogen fluoride specified herein. In order to maintain the pH of the reaction mixture, it may be necessary to add a base such as sodium hydroxide (NaOH) or ammonium hydroxide ($NH_4OH$) to remove the excess hydrogen ions.

Nitrate ions in the form of nitric acid may also be added during the etching step to maintain one or both of the solution pH or nitrate concentration, where necessary.

It may also be necessary to add a base to remove any excess hydrogen ions generated in solution upon addition of the nitric acid used to remove the dendritic silver at the end of the etching step.

Apart from water, the solution according to an embodiment of the present invention may contain no other ingredients. Such a solution would at the start of the process consist essentially of:

0.01 to 5M HF
0.002 to 0.2M $Ag^+$ ions
0.001 to 0.7M $NO_3^-$ ions
water, and optionally
$SiF_6^{2-}$ ions,
alkali metal or ammonium ions, and
incidental additions and impurities.

It is important to ensure that the amount of solution used relative to the amount of silicon granules should be sufficient for both nucleation and etching. It has been found, for example, that the concentration and amount of solution required for etching the silicon substrate depends upon both the amount and size of silicon granules used. Smaller granules having a larger surface area tend to require either the use of an etching solution having a higher concentration of HF or a larger volume of a fixed HF concentration etching solution. We have found that where nucleation and etching are carried out simultaneously or in the same bath, the best results have been obtained by using 1 to 10 g, suitably 2 to 8 g and preferably 4 to 8 g of silicon granules of dimensions 15 to 25 µm and having a BET surface area of approximately 0.636 $m^2/g$ for every liter of etching solution having an HF concentration in the range 2 to 3.5M. Where nucleation is carried out separately to etching it has been found that it is possible to treat up to 30 g/l of silicon granules of dimensions 15 to 25 µm and having a BET surface area of approximately 0.636 $m^2/g$ for every liter of nucleating solution having an HF concentration of 2M; 60 g/l of silicon granules of dimensions 15 to 25 µm and having a BET surface area of approximately 0.636 $m^2/g$ can be etched for every liter of etching solution having an initial HF concentration of 7.5M. These relative proportions may need to be adjusted as the quantities are scaled up or down.

Other aspects of the invention provide pillared particles or fibres made by the process and a composite electrode, especially an anode, containing such particles or fibres together with a current collector, which may optionally be made of copper. The composite electrode may be made by preparing a solvent-based slurry containing pillared particles or fibres made by the above process, coating the slurry onto a current collector and evaporating the solvent to create a composite film.

The present invention further provides an electrochemical cell, e.g. a rechargeable cell, containing an electrode as defined above and a cathode that comprises a lithium-containing compound capable of releasing and reabsorbing lithium ions as its active material. The cathode is typically prepared by applying a mixture of a cathode active material, a conductive material and a binder to a cathode current collector and drying. Examples of cathode active materials that can be used together with the anode active materials of the present invention include, but are not limited to, layered compounds such as lithium cobalt oxide, lithium nickel oxide or compounds substituted with one or more transition metals such as lithium manganese oxides, lithium copper oxides and lithium vanadium oxides. Examples of suitable cathode materials include $LiCoO_2$, $LiCo_{0.99}Al_{0.01}O_2$, $LiNiO_2$, $LiMnO_2$, $LiCO_{0.5}Ni_{0.5}O_2$, $LiCO_{0.7}Ni_{0.3}O_2$, $LiCO_{0.8}Ni_{0.2}O_2$, $LiCO_{0.82}Ni_{0.18}O_2$, $LiCo_{0.8}Ni_{0.15}Al_{0.05}O_2$, $LiNi_{0.4}CO_{0.3}Mn_{0.3}O_2$, $LiNi_{0.8}CO_{0.15}Al_{0.05}O_2$, $LiMn_xNi_xCO_{1-2x}O_2$ or $LiFePO_4$ and $LiNi_{0.33}Co_{0.33}Mn_{0.34}O_2$. The cathode current collector is generally of a thickness of between 3 to 500 µm. Examples of materials that can be used as the cathode current collector include aluminium, stainless steel, nickel, titanium and sintered carbon.

Silicon fibres can be made by detaching the pillars from a product according to the first aspect of the invention. One or more techniques such as scraping, agitating (especially by ultrasonic vibration) or chemical etching can be used to remove the pillars. Alternatively, the fibres can be made by completely or partially etching away the particle core so that they become detached in the treating solution. The silicon fibres thereby made are preferably at least 1 µm long, more preferably at least 3 µm long, most preferably at least 5 µm long, especially at least 10 µm long. The lengths thereby produced are preferably in the range of 1-500 µm, more preferably 1-100 µm, most preferably 5-80 µm, especially 10-50 µm.

The structured particles and fibres of the invention provide a good reversible reaction of silicon with lithium in a rechargeable cell. In particular by arranging the particles or fibres in a composite structure, that is a mixture of particles or fibres, a polymer binder and a conductive additive, or by directly bonding the particles or fibres to a current collector, the charge/discharge process becomes reversible and repeatable and good capacity retention is achieved. See, for example WO 2009/010757 and WO 2009/010759. This good reversibility is considered by the present inventors to be due to the ability of both the silicon pillars forming part of the structured silicon particle and the silicon fibres to absorb the volumetric expansion/contraction associated with lithium insertion/extraction from the host silicon without the pillars being broken up or destroyed.

Importantly, the process described in this invention can use a low purity, metallurgical grade silicon as the feedstock silicon granules and hence reduces the cost of making silicon particles and fibres for use in electrodes of rechargeable cells as compared to the prior art use of silicon wafers as feedstock. As already mentioned, the silicon granules may be predominantly n- or p-type and may be etched on any exposed crystal face. Since the etching proceeds along crystal planes, the resulting pillars are single crystals. Because of this structural feature, the pillars will be substantially straight facilitating length to diameter ratio of greater than 10:1.

In overview the invention provides a safe and controllable process for making pillared particles of silicon or silicon fibres that are of especial application for use in rechargeable lithium ion cells The invention will now be illustrated by reference to one or more of the following non-limiting examples. Variations on these examples falling within the scope of the invention will be apparent to a person skilled in the art. The silicon based structures prepared according to the process of the present invention can be used to fabricate devices such as fuel cells, field emitting diodes, chromatographic materials, solar cells, solar capacitors, filters, sensors and electrical capacitors.

EXAMPLE 1

To Obtain Pillared Particles

The reaction was conducted in a light transmitting polyethylene container with 8 liter volume. Access is provided for introducing ingredients. A stirrer is also provided. The following reactants were used:

| | |
|---|---|
| Silicon Powder - Si | Elkem Silgrain HQ (15-40 μm), having a particle size of 15-25 μm; larger particle sizes (26 to 40 μm) were eliminated by sieving and washing the powder in deionised water 3 times |
| Hydrofluoric acid - HF | Aldrich Honeywell, 17735, 40% (w/w) semiconductor grade PURANAL ™ |
| AgNO₃ | Powder |
| Sodium nitrate - NaNO₃ | Sigma-Aldrich, Anhydrous, crystal powder, ACS reagent, ≥99.0% |
| Sodium hydroxide - | VWR BDH AnalaR, Lot B0138150 734, Prod 102525P |
| HNO3 solution | 3.65M |

The reaction was conducted at room temperature 15 to 30° C. 21 g of $AgNO_3$ is mixed with 3 liters 2M HF solution in the reaction chamber. 5.1 gram NaOH dissolved in 30 ml water may be added if necessary. The resulting solution contains 66 mM $AgNO_3$.

24 gram sieved Si powder (<25 μm) is added through the hole in the lid of the container by means of a funnel, and then the mass is gently stirred by hand, through the hole in the lid using a rod, for 1 minute.

This reaction mixture is allowed to stand for 40 minutes. A "mat" of silicon plus silver forms on the surface of the etch solution in the first 1-2 minutes.

After 40 minutes, 15 gram $NaNO_3$ (or 13 gram $NH_4NO_3$) is added. The $NaNO_3$ or $NH_4NO_3$ is dissolved into 50 ml water and then added through the funnel. The solution is then stirred for about 1 min after the $NaNO_3$ or $NH_4NO_3$ addition has been completed. The mixture is allowed to stand for a further 250 minutes. Then at 295 minutes from the start of the process, when the etching is almost complete, the spent etching solution starts to be pumped into a storage chamber, which takes about 4-5 minutes so the total etching time is about 300 minutes.

The mat is now washed with 3-4 liter water three times. The first two washes are such that the water is in contact for five minutes, while the third wash is a one minute wash. The wet mat, which is silicon and silver, should be promptly treated with nitric acid to remove the silver. The etched silicon is further washed and stored wet. The washing water contains silver and may be set aside to recover the silver content.

EXAMPLE 2

To Obtain Detached Fibres 36 g of $AgNO_3$ is added to 3 liters of a 2M HF solution.

12 gram Si powder (Elkem Silgrain™ 200-800 μm) is added through a funnel at top of the container and the mass is gently stirred by hand, through the hole in the lid using a rod, for 1 minute. This reaction mixture is allowed to stand for 60 minutes. The concentration of HF in the etching solution is monitored during the etching step and further HF is added to the solution to maintain the concentration of HF at 2M. The "mat" of silicon plus silver forms on the surface of the etch solution in the first 1-2 minutes.

At the end of the 60 minutes, 52 gram $NaNO_3$ (or 48 gram $NH_4NO_3$) is added. The $NaNO_3$ or $NH_4NO_3$ is dissolved into 50 ml water and then added through funnel at top. The mixture is gently stirred for a further 235 minutes. Then at 295 minutes from the start of the process, when the etching is almost completed, the spent etching solution starts to be pumped into a storage chamber, which takes about 4-5 minutes, and so the total etching time is about 300 minutes. Then the mat is washed with 3-4 liter water three times. The first two washes are such that the water is in contact for five minutes, while the third wash is a one minute wash.

The wet mat, which is composed of silicon and silver, should be promptly treated with nitric acid for 5~10 min to remove silver. The silicon is further washed and stored wet. The washing water contains silver and may be set aside to recover the silver content.

Fibres can be harvested from the resulting particles, with pillars attached, by ultrasonic vibration by placing the particles in a beaker or any appropriate container, covering the particles with an inert liquid such as ethanol or water and subjecting them to ultrasonic agitation. It is found that within several minutes the liquid is seen to be turbid and it can be seen by electron microscope examination that at this stage the pillars have been removed from the particle.

The pillars may be removed from the particle in a two stage process. In the first stage, the particles are washed several times in water and, if necessary, dried in a low vacuum system to remove the water. In the second stage, the particles are agitated in an ultrasonic bath to detach the pillars. These are suspended in water and then separated using a centrifuge to collect the silicon fibres.

Figure 4:
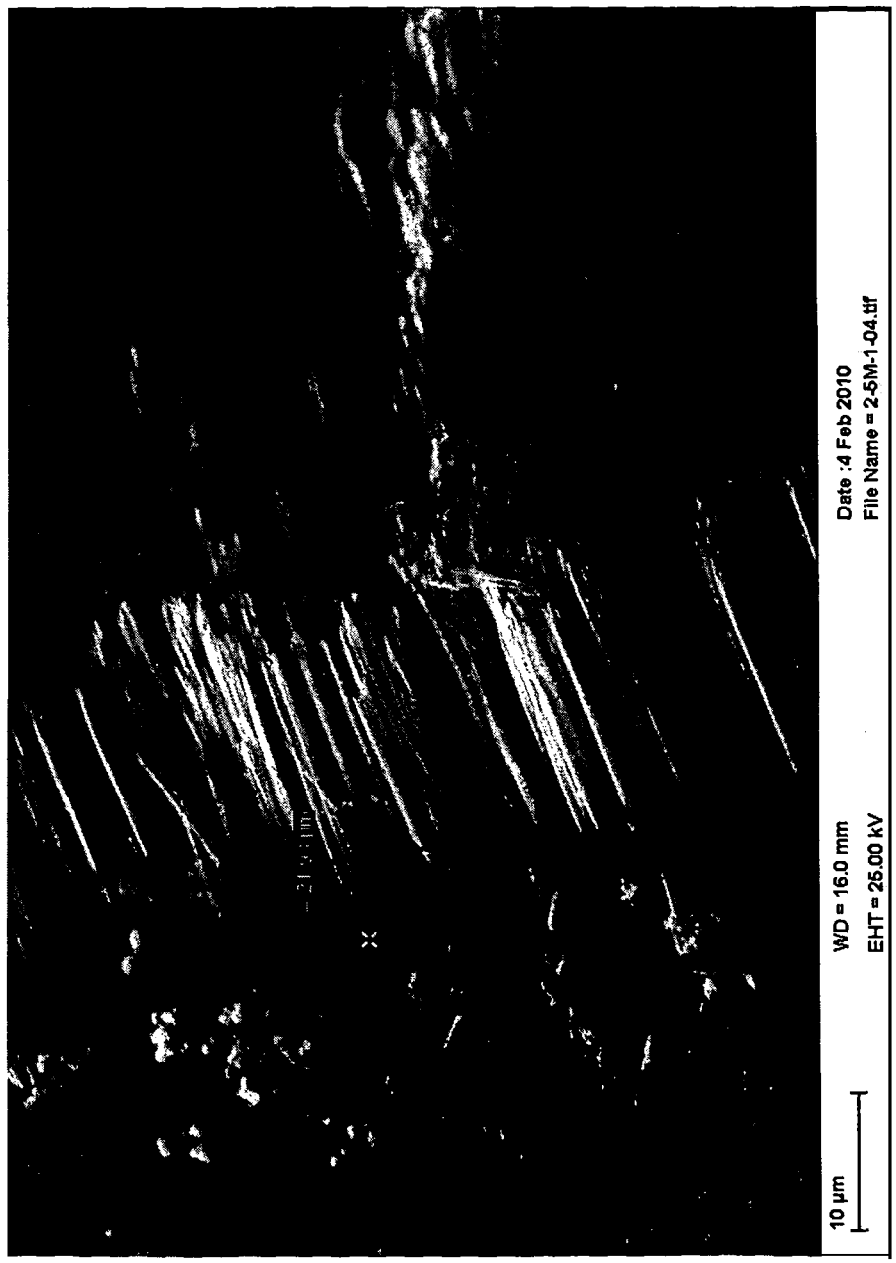
FIG. 4 is an electron micrograph of fibres produced according to the method of the invention using a 2.5M HF solution.
Figure 5:
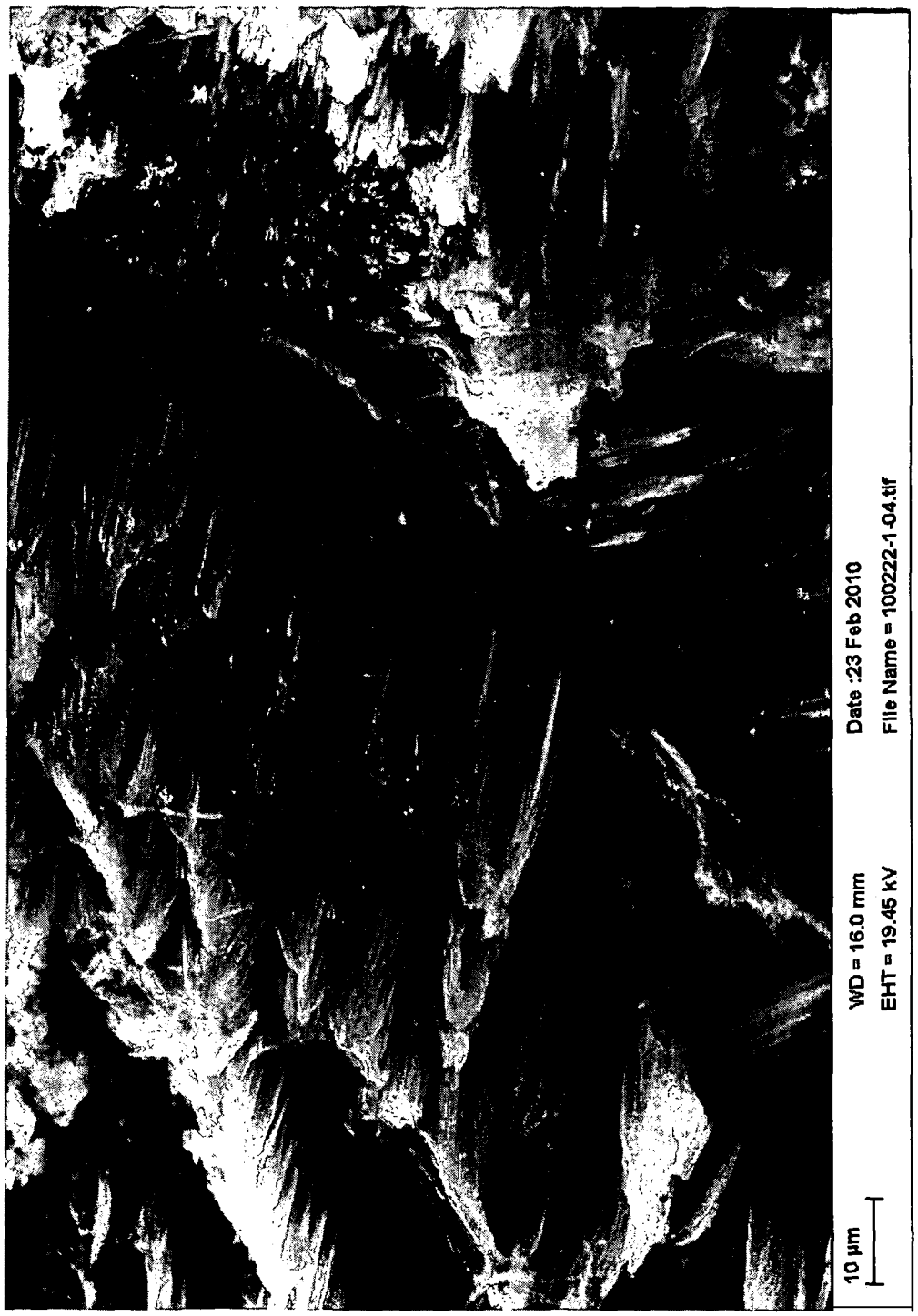
FIG. 5 is an electron micrograph of a pillared particle produced according to the method of Example 2 of the present invention.

Fibres prepared using an HF solution of concentration 2.5M are shown in FIG. 4.

EXAMPLE 3

Preparation of Silicon-Containing Pillared Particles by Nucleating and Etching at Less than 5M HF Silicon granules (ELKEM Silgrain HQ J318) having a particle size of less than 25 μm (as determined by sieve) and a surface area as determined by BET surface area measurement of 0.638 $m^2/g$ were mixed at a silicon loading of 8 g/l with a treating solution comprising HF at a concentration of 2M and $AgNO_3$ (Johnson-Matthey) at a concentration of 23.5 mM. The solution was gently stirred for 15 to 30 minutes during which time nucleation of silver metal on the surface of the silicon material was observed.

The nucleated silicon product was removed from the spent nucleation solution and transferred to an etching bath. Ammonium nitrate (150 mM) (Analytically pure) was added to the solution in the etching bath in four separate portions over a period of one hour (6 g every 15 minutes) and the reaction was allowed to proceed for a further 3.5 hours at a temperature of up to 40° C. until the etching step was complete (the HF concentration typically falls to 3M over this period). The total reaction volume was 500 ml; a 1 liter polyethylene reaction vessel was used.

Figure 6:
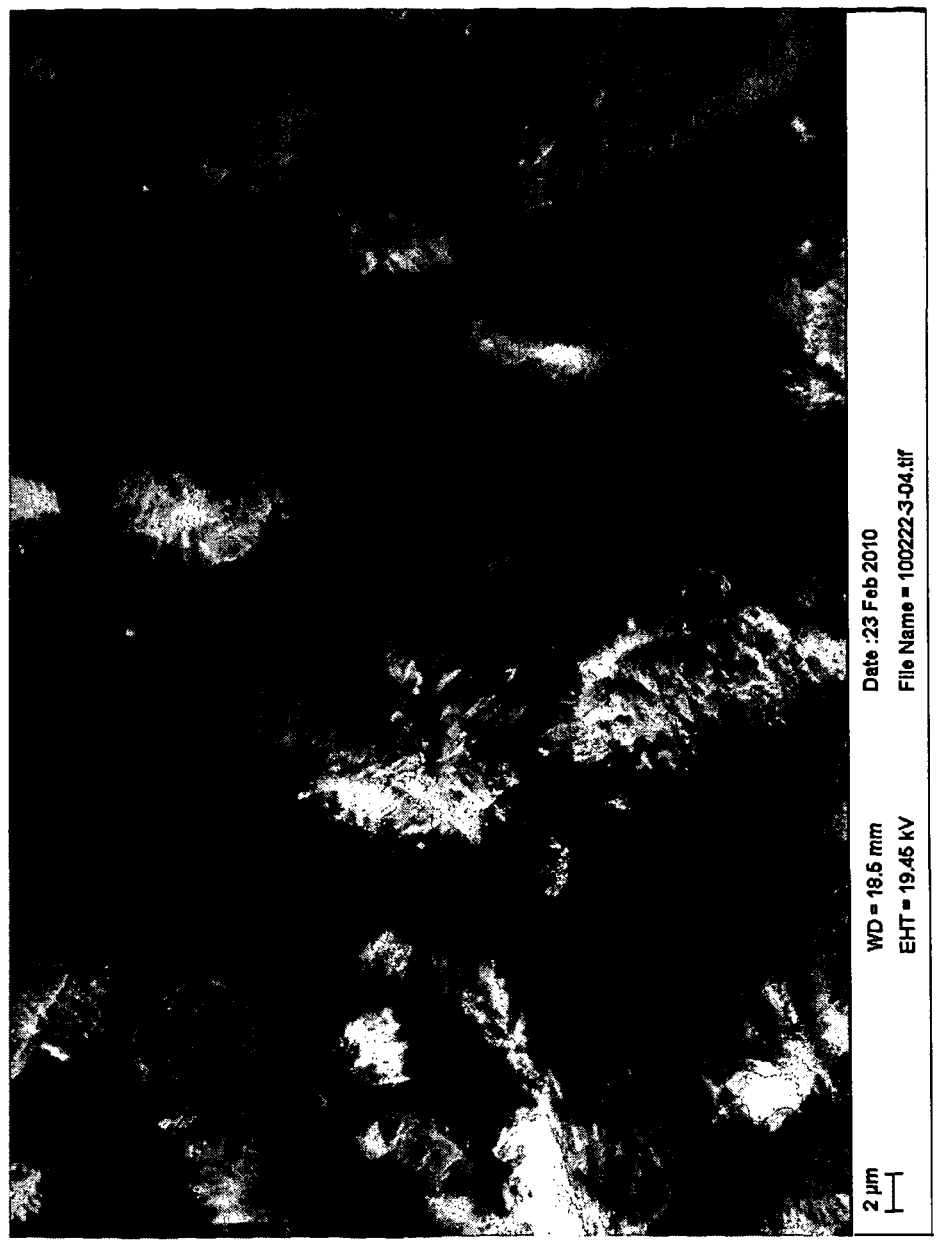
FIG. 6 is an electron micrograph of pillared particles produced according to the method of the invention using a treatment solution having an HF concentration of less than 5M for both the nucleation and the etching steps.

The product was removed from the reaction solution by filtering and nitric acid was added thereto to remove the silver mat. The final product was washed with water and stored under water to prevent the pillars fusing together at their ends. The pillared particles thus obtained were characterised by a pillar length of 2.5 μm. Pillared particles prepared in accordance with example 3 are illustrated in FIG. 6.

EXAMPLE 4

Preparation of Silicon-Containing Pillared Particles by Nucleating Using a Treatment Solution Having an HF Concentration of Less than 5M and Etching Using a Treatment Solution Having an HF Concentration of Greater than 5M HF Silicon granules (ELKEM Silgrain HQ J318) having a particle size of less than 25 μm (as determined by sieve) and a surface area as determined by BET surface area measurement of 0.638 m$^2$/g were mixed at a silicon loading of 30 g/l with a treating solution comprising HF (Honeywell PURANAL, semiconductor grade) at a concentration of 2M and AgNO$_3$ (Johnson-Matthey) at a concentration of 44 mM. The solution was gently stirred for 30 minutes during which time nucleation of silver metal on the surface of the silicon material was observed.

The nucleated silicon product was removed from the spent nucleation solution and transferred to an etching bath. HF (7.5M) was added to the etching bath. Sodium nitrate (Sigma-Aldrich ACS reagent, >99.0%) (127.5 g) was added to the reaction chamber in eight portions over a period of 1.5 to 2 hours. The reaction mixture was then gently stirred for a further 2.5 to 3 hours at a temperature of not more than 45° C. until the etching step was complete (the HF concentration typically falls to 3M over this period). The total reaction volume was 1000 ml; a 2 liter polyethylene reaction vessel was used.

Figure 7:
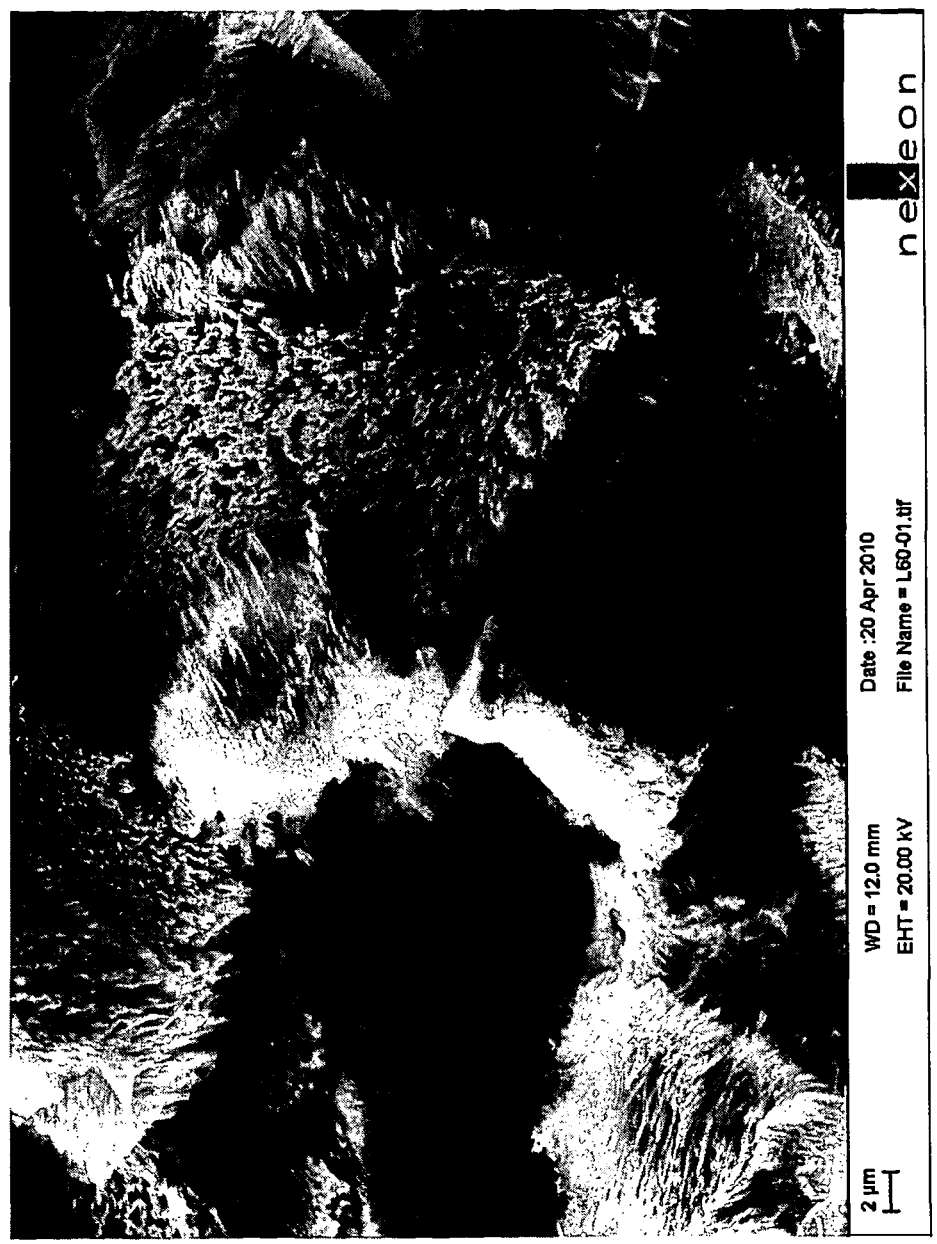
FIG. 7 is an electron micrograph of pillared particles produced according to the method of the invention using a treatment solution having an HF concentration of less than 5M for both the nucleation step and a treating solution having an HF concentration of greater than 5M for the etching step.

The product was removed from the reaction solution by filtering and nitric acid was added thereto to remove the silver mat. The final product was washed with water and stored under water to prevent the pillars fusing together at their ends. The pillared particles thus obtained were characterised by a pillar length of 2.5 to 3 μm. Pillared particles prepared in accordance with example 4 are illustrated in FIG. 7.

EXAMPLE 5

Preparation of Silicon-Containing Fibres by Nucleating Using a Treatment Solution Having an HF Concentration of Less than 5M and Etching Using a Treatment Solution Having an HF Concentration of Greater than 5M HF Silicon granules (ELKEM Silgrain HQ 200-800 μm, Lot no. Breq7223) having a particle size in the range 200-800 μm (as determined by sieve) were mixed at a silicon loading of 2 g/l with a treating solution comprising HF (Honeywell PURANAL, semiconductor grade) at a concentration of 2.5M and AgNO$_3$ (Johnson-Matthey) at a concentration of 11.8 mM. The solution was gently stirred for between 15 and 30 minutes during which time nucleation of silver metal on the surface of the silicon material was observed.

The nucleated silicon product was removed from the spent nucleation solution and transferred to an etching bath. HF (7.5M) was added to the etching bath. Ammonium nitrate (Sigma-Aldrich ACS reagent, >98.0%) (1 g, 150 mM) was added to the reaction chamber in four portions over a period of one hour. The reaction mixture was then gently stirred for a further 30 minutes to one hour at a temperature of not more than 40° C. until the etching step was complete (the HF concentration typically falls to 3M over this period). The total reaction volume was 500 ml; a 1 liter polyethylene reaction vessel was used.

Figure 8:
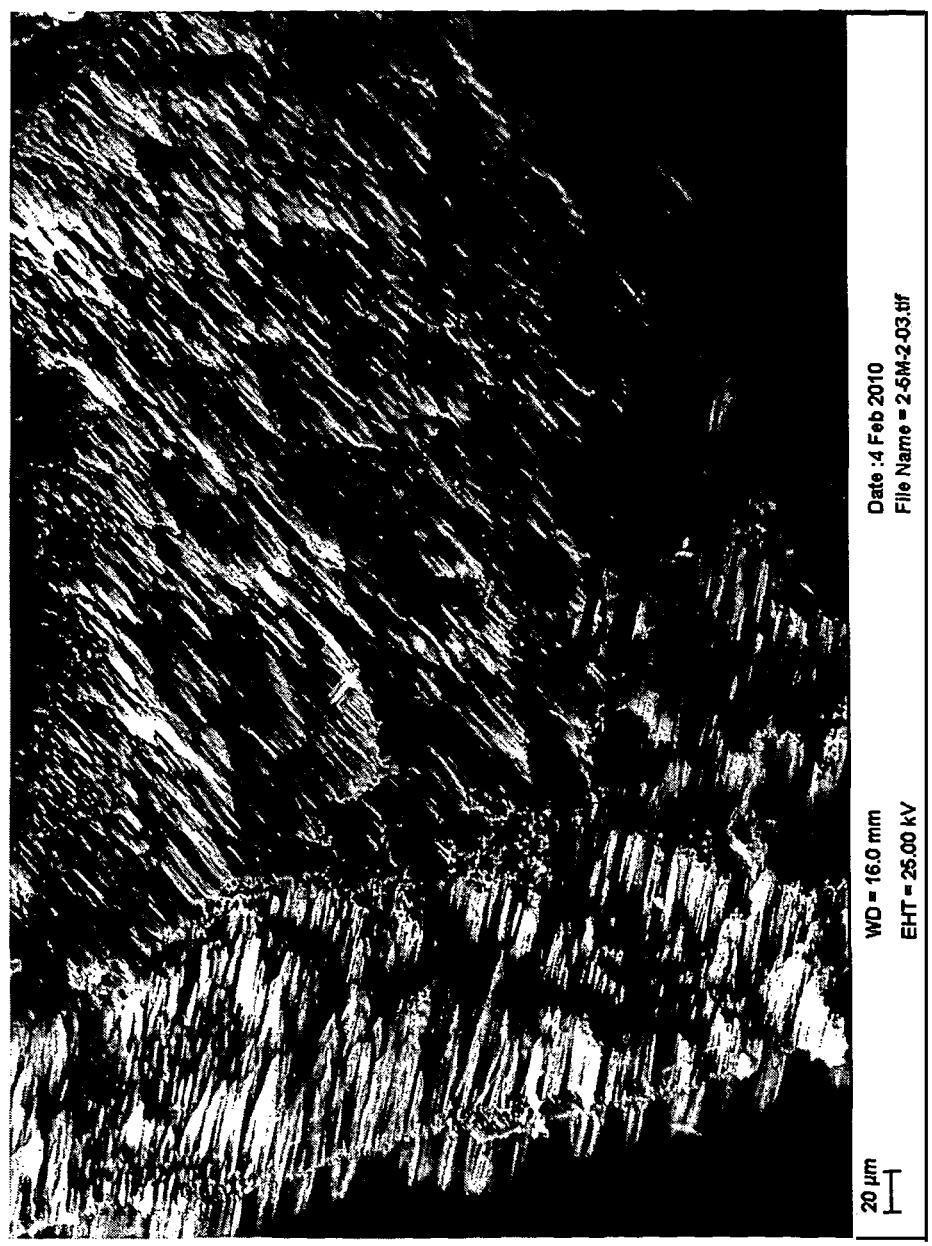
FIG. 8 is an electron micrograph of fibres produced according to the method of the invention using a treatment solution having an HF concentration of less than 5M for both the nucleation step and a treating solution having an HF concentration of greater than 5M for the etching step.

The product was removed from the reaction solution by filtering and nitric acid was added thereto to remove the silver mat. The final product was washed with water and stored under water to prevent the pillars fusing together at their ends. The fibres thus obtained were characterised by a pillar length of 30 to 40 μm. Pillared particles prepared in accordance with example 5 are illustrated in FIG. 8.

EXAMPLE 6

Making an Anode

The pillared particles or fibres are used as the active material in a composite anode for lithium-ion electrochemical cells. To fabricate a composite anode, the pillared particles or fibres are mixed with polyvinylidene difluoride or another suitable polymer binder, optionally together with other components, for example, conductive particles, other active materials or fillers, and made into a slurry with a casting solvent such as n-methylpyrrolidinone. This slurry can then be applied or coated onto a metal plate or metal foil or other conducting substrate for example physically with a blade or in any other appropriate manner to yield a coated film of the required thickness and the casting solvent is then evaporated from this film using an appropriate drying system which may employ elevated temperatures in the range of 50° C. to 140° C. to leave the composite film free or substantially from casting solvent. The resulting composite film has a porous structure in which the mass of silicon-based pillared particles or fibres is typically between 5 percent and 95 percent. The composite film preferably has a percentage pore volume of 10-70 percent, more preferably 20-60%.

Electrodes can also be fabricated using, for example, polyacrylic acid or CMC instead of polyvinylidene difluoride as the binder.

Fabrication of the lithium-ion battery cell thereafter can be carried out in any appropriate manner for example following the general structure shown in FIG. 1 but with a silicon-comprising active anode material rather than a graphite active anode material. For example the silicon particle-based composite anode layer is covered by the porous spacer 18, the electrolyte added to the final structure saturating all the available pore volume. The electrolyte addition is done after placing the electrodes in an appropriate casing and may include vacuum filling of the anode to ensure the pore volume is filled with the liquid electrolyte.

Capacity retention is improved as the pillared structure of the silicon pillar particles or fibres allows for accommodation of the volume expansion associated with insertion/extraction (charging and discharging) of lithium, without pulverisation or excessive swelling of the composite.

Large sheets of silicon-based anode can be fabricated and then rolled or stamped out subsequently as is currently the case in graphite-based anodes for lithium-ion battery cells meaning that the approach described herein can be retrofitted with the existing manufacturing capability.

The invention claimed is:

1. A method of treating silicon to form elongate structures on a treated surface, the method comprising a nucleation step in which metal is deposited on the silicon surface and an etching step in which silicon underlying the deposited metal is etched, wherein
   a. the nucleation step comprises exposing a silicon containing material to a solution comprising HF at a concentration of less than 5M and 0.002 to 0.2M of metal ions capable of nucleating on and forming a porous layer comprising regions of elemental metal on the silicon surface; and
   b. the etching step comprises
      i. exposing the silicon surface comprising regions of elemental metal to a solution comprising HF at a concentration of greater than 5M and 0.001 to 0.70M of an oxidant selected from the group comprising $O_2$, $O_3$, $H_2O_2$, the acid, ammonium or alkali metal salt of $NO_3^-$, $S_2O_8^{2-}$, $B_4O_7^{2-}$ and $ClO_4^-$ or a mixture thereof; and
      ii. adding oxidant to the solution during etching to maintain the concentration of oxidant within the above range.

2. A method according to claim 1, wherein the concentration of HF used during the nucleation step is in the range 0.01 to 4M.

3. A method according to claim 1, wherein the etching step is carried out at an HF concentration of no greater than 10M.

4. A method according to claim 1, wherein the etching step is carried out at an HF concentration of 7.5M.

5. A method according to claim 1, wherein further HF is added to the etching solution to maintain the concentration of HF within the stated range.

6. A method according to claim 1, wherein the HF concentration in the etching solution is 0.5 to 2M greater than the HF concentration in the nucleating solution.

7. A method according to claim 1, wherein the nucleation solution comprises 0.001 to 0.7M of an oxidant.

8. A method according to claim 1, wherein the oxidant is added to the etching solution in one or more discrete steps or continuously over the duration of the etching period to maintain the concentration of oxidant and/or HF within the specified concentration ranges.

9. A method according to claim 1, wherein the nucleation step and the etching step are carried out in separate baths.

10. A method according to claim 1, wherein the nucleation step and the etching step are carried out simultaneously.

11. A method according to claim 1, wherein the oxidant is added at the end of the nucleation step.

12. A method according to claim 1, which comprises the steps of:
   a. Exposing silicon-containing material to a solution comprising
      i. 0.01 to 4 MHF
      ii. 0.002 to 0.2 M $Ag^+$ to form a silver-coated silicon product; and
   b. Mixing the silver-coated silicon product of step (a) with HF to give a solution comprising no greater than 10M HF, with the proviso that the concentration of HF in the solution at the end of step (b) is greater than the concentration of HF in the solution in step (a);
   c. Adding $NO_3^-$ to the solution formed in (b) to maintain the concentration of $NO_3^-$ within the concentration range 0.003 to 0.7M, wherein the $NO_3^-$ ions are in the form of an alkali metal nitrate salt, ammonium nitrate or nitric acid.

13. A method according to claim 1, wherein the solution contains less than 0.5 wt % ferric ions.

14. A method according to claim 1, wherein the solution contains less than 0.5 wt % alcohol.

15. A method according to claim 1, wherein the metal ions are selected from the group silver, gold, platinum, copper, nickel, lead, cobalt, cadmium, chromium, zinc and tin.

16. A method according to claim 15, wherein the metal ion is a silver ion used at a concentration of 0.01 to 0.15M.

17. A method according to claim 1, wherein the oxidant is selected from the group comprising $O_2$, $O_3$, $H_2O_2$ and the acid, ammonium or alkali metal salt of $NO_3^-$.

18. A method according to claim 1, wherein the silicon comprises undoped silicon, doped silicon of either p-type or n-type or a mixture thereof.

19. A method according to claim 1, wherein the elongate structures formed on a treated surface have a diameter in the range 0.02 to 0.7 µm.

20. A method according to claim 1, wherein the elongate structures formed on a treated surface have an aspect ratio in the range 5:1 to 100:1.

21. A method according to claim 1, wherein the concentration of $NO_3^-$ is maintained by continuous addition of $NO_3^-$ ions to the solution.

22. A method according to claim 1, wherein the concentration of $NO_3^-$ is maintained by adding $NO_3^-$ ions to the solution in one or more steps.

23. A method according to claim 1, wherein at least one of the nucleation step and the etching step is conducted at a temperature of 0 to 70° C.

24. A method according to claim 1, wherein the silicon loading in the treatment solution is in the range 2 to 60 g/l.

25. A method according to claim 24, wherein the silicon is in granular form, the granules having a particle size in the range 1 µm to 1.5 mm.

26. A method according to claim 25, wherein when the silicon granule has a diameter of the order of 25 µm, the silicon loading is in the range 15 to 40 g/l.

27. A method according to claim 25, wherein when the silicon granule has a diameter of the order of 200 to 800 µm, the silicon loading is in the range 2 to 8 g/l.

28. A method according to claim 1 wherein the elongate structures are selected from pillars, rods, columns, nanowires, tubes, fibers, ribbons and flakes.

* * * * *